United States Patent
Shibanuma et al.

(10) Patent No.: US 8,906,517 B2
(45) Date of Patent: Dec. 9, 2014

(54) ORGANIC ELECTROLUMINESCENCE DEVICE

(75) Inventors: Tetsuo Shibanuma, Kanagawa (JP); Eisuke Matsuda, Kanagawa (JP); Yasunori Kijima, Tokyo (JP); Hirofumi Nakamura, Kanagawa (JP); Shigeyuki Matsunami, Kanagawa (JP)

(73) Assignee: Sony Corporation, Tokyo (JP)

( * ) Notice: Subject to any disclaimer, the term of this patent is extended or adjusted under 35 U.S.C. 154(b) by 1267 days.

(21) Appl. No.: 11/278,456

(22) Filed: Apr. 3, 2006

(65) Prior Publication Data
US 2006/0220534 A1 Oct. 5, 2006

(30) Foreign Application Priority Data

Apr. 4, 2005 (JP) .............................. P2005-107036
Jun. 17, 2005 (JP) .............................. P2005-177215

(51) Int. Cl.
*H01L 51/54* (2006.01)
*H05B 33/12* (2006.01)
*H05B 33/28* (2006.01)
*H01L 51/50* (2006.01)
*H01L 51/52* (2006.01)
*H05B 33/22* (2006.01)
*H01L 51/00* (2006.01)

(52) U.S. Cl.
CPC ............ *H05B 33/28* (2013.01); *H01L 51/5092* (2013.01); *H01L 51/0059* (2013.01); *H01L 51/5278* (2013.01); *H01L 51/0081* (2013.01); *H01L 2251/5315* (2013.01); *H01L 51/5234* (2013.01); *H05B 33/22* (2013.01); *Y10S 428/917* (2013.01)
USPC ........... 428/690; 428/917; 313/502; 313/504; 257/40

(58) Field of Classification Search
USPC ........................................ 428/690
See application file for complete search history.

(56) References Cited

U.S. PATENT DOCUMENTS

| 6,013,384 | A * | 1/2000 | Kido et al. ..................... 428/690 |
| 6,284,393 | B1 | 9/2001 | Hosokawa et al. |
| 6,436,559 | B1 * | 8/2002 | Ueno et al. ..................... 428/690 |
| 6,492,041 | B2 * | 12/2002 | Ishiskawa et al. ............. 428/690 |
| 6,565,996 | B2 * | 5/2003 | Hatwar et al. ................. 428/690 |
| 6,717,358 | B1 * | 4/2004 | Liao et al. ..................... 313/504 |
| 7,494,722 | B2 * | 2/2009 | Liao et al. ..................... 428/690 |
| 2002/0158242 | A1 * | 10/2002 | Son et al. ........................ 257/40 |
| 2002/0185969 | A1 * | 12/2002 | Raychaudhuri et al. ....... 313/506 |
| 2003/0164678 | A1 * | 9/2003 | Shirota et al. ................. 313/504 |
| 2004/0061436 | A1 * | 4/2004 | Ogawa et al. ................. 313/506 |
| 2004/0076852 | A1 * | 4/2004 | Cheng et al. .................. 428/690 |
| 2004/0263072 | A1 * | 12/2004 | Park et al. ..................... 313/509 |
| 2005/0006641 | A1 * | 1/2005 | Tung et al. ...................... 257/40 |
| 2005/0248267 | A1 * | 11/2005 | Gyoutoku et al. ............. 313/506 |

FOREIGN PATENT DOCUMENTS

| JP | 10-162959 | 6/1998 | |
| JP | 10-284255 | 10/1998 | |
| JP | 11-008072 | 1/1999 | |
| JP | 11-176577 | 7/1999 | |
| JP | 2003-519432 | 6/2003 | |
| JP | 2003-249353 | 9/2003 | |
| JP | 2003-272860 | 9/2003 | |
| JP | 2004134395 A | * 4/2004 | ............ H05B 33/14 |
| JP | 3560375 | 6/2004 | |
| JP | 2004-296410 | 10/2004 | |
| JP | 2004-327414 | 11/2004 | |
| WO | 2004/054326 | 6/2004 | |

OTHER PUBLICATIONS

Japanese Office Action issued on Jun. 1, 2011 in connection with counterpart Japanese Application No. 2005-107036.
Japanese Office Action issued on Mar. 15, 2011 in connection with counterpart JP application No. 2005-177215.

* cited by examiner

*Primary Examiner* — Andrew K Bohaty
(74) *Attorney, Agent, or Firm* — Dentons US LLP

(57) ABSTRACT

An organic electroluminescence device including a lower electrode disposed on a substrate, an organic layer having at least a light emission layer and disposed above the lower electrode, and upper electrode having a transparent conductive film and disposed above the organic layer, in which the device has an electron injecting layer between the organic layer and the upper electrode. The electron injecting layer has a buffer layer comprising an insulative material and a mixed layer comprising an organic material that has an electron transporting property and a metal material that has an electron injecting property.

21 Claims, 6 Drawing Sheets

ORGANIC ELECTROLUMINESCENCE DEVICE

CROSS REFERENCE TO RELATED APPLICATIONS

The present invention contains subject matter related to Japanese Patent Application JP 2005-107036 filed on Apr. 4, 2005 and JP 2005-177215 filed on Jun. 17, 2005 in the Japanese Patent Office, the entire contents of which being incorporated herein by reference.

BACKGROUND OF THE INVENTION

1. Field of the Invention

The present invention concerns an organic electroluminescence device.

2. Description of the Related Art

Organic electroluminescence devices are light emitting devices capable of operating at low voltage and suitable to saving of power consumption. Accordingly, they have now been used generally as light emitting devices for use in display devices and illumination devices. The organic electroluminescence device usually has a structure in which a lower electrode, an organic layer formed by laminating an organic hole transporting layer and an organic light emitting layer, and an upper electrode in this order above a substrate. Further, one of the lower electrode and the upper electrode sandwiching the organic layer is used as an anode and the other of them is used as a cathode.

A structure in which the upper electrode is formed as a transparent electrode and emission light caused in the device is taken out on the side of the upper electrode is referred to as a top emission organic electroluminescence device. There is also a structure of using a semi-transparent upper electrode thereby resonating emission light generated in the device. Further, there is also a structure of taking out light from both of the upper electrode and the lower electrode.

In a structure using the upper electrode as a transparent electrode, in a case of using the upper electrode as a cathode (that is, transparent cathode), a portion in contact with the organic layer has an electron injecting layer particularly formed of a material having high light transmittance selected from materials having low work function. However, it may be difficult to find materials of sufficiently high light transmittance among the materials having low work function.

Then, it has been proposed a first structure having an electron injecting layer of a super thin film comprising a metal material having low work function disposed to a portion on the side of a cathode in contact with an organic layer, and a transparent conductive layer comprising an Indium-Tin-Oxide (ITO), Indium-Zinc-Oxide (IZO); etc. disposed further thereon (refer to JP No. 3560375 and JP-A No. 10-162959).

Further, it has been proposed a second structure having the electron injecting layer as a mixed layer comprising a metal material having low work function and an electron transporting organic material (refer to JP-A No. 10-162959).

Further, it has been proposed a third structure having an electron injecting layer of a laminate structure. In this case, the electron injecting layer is formed by laminating a metal layer comprising a metal material having low work function, and a mixed layer comprising a metal material having low work function and an electron transporting organic material orderly from the side of the organic layer. The electron injecting layer is disposed directly on the light emission layer (refer to JP-A 2004-296410).

SUMMARY OF THE INVENTION

However, in the first structure and the second structure described above, since the transparent conductive film comprising ITO, etc. disposed on the electron injecting layer is usually formed by a sputtering method in an oxygen atmosphere, a metal material having low work function such as an alkali metal or an alkaline earth metal forming the electron injecting layer is oxidized upon formation of the transparent conductive layer. This can no more ensure a sufficient electron injecting efficiency from the electron injecting layer to the organic layer and no sufficient life can be obtained compared with a device of using a not-transparent cathode (for example, Mg—Ag alloy, Al, etc. of a thick film of about 100 nm).

Further, in the third structure, the electron injecting layer has a two-layered structure. Accordingly, during formation of the transparent conductive film, the mixed layer that forms the upper layer of the electron injecting layer serves as an oxidation protective film to prevent oxidation of the metal layer disposed in adjacent with the organic layer. Accordingly, the electron injecting efficiency is not impaired. However, since the metal layer is not oxidized as a result, light absorption inherent to the metal remains and possibly making it difficult to ensure light transmittance.

Further, in JP-A No. 2004-296410 that discloses the third structure, the metal layer (electron injecting layer) is disposed in contact with the light emission layer that forms the organic layer. In this case, the electron injecting layer can not provide a hole blocking property as a function inherent to the layer. Then, holes can not be confined sufficiently in the light emission layer to decrease the probability of re-combination between holes and electrons in the light emission layer. Accordingly, light emission efficiency is lowered. Further, since the metal layer (electron injection layer) is disposed in contact with the light emission layer that forms the organic layer, the electron transportability increases excessively in the device. Accordingly, balance between the holes and the electrons is worsened giving rise to a problem that no sufficient luminance half-decay life can be obtained.

In view of the above, the present invention intends to provide an organic electroluminescence device having a structure of taking out emitted light on the side of an upper electrode used as a cathode, in which the upper electrode of the organic layer has a sufficient transmittance to the emission light, an appropriate electron injecting efficiency and a hole blocking property from the upper electrode to the organic layer are ensured properly thereby capable of improving the light emission intensity and the light emission life.

According to an embodiment of the invention, there is provided an electroluminescence device including a lower electrode disposed on a substrate, an organic layer having at least a light emission layer and disposed above the lower electrode, and an upper electrode having a transparent conductive film and disposed on the organic layer. Particularly, a buffer layer formed of an insulative material, and an electron injecting layer are laminated orderly from the side of the organic layer between the organic layer and the upper electrode. The electron injecting layer has a mixed layer comprising an organic material that has an electron transporting property and a metal material that has an electron injecting property.

Since the buffer layer comprising the insulative material, it can easily ensure the light transmittance. Further, since the mixed layer comprises the organic material and the metal material, the metal material reacts while reducing the organic material and becomes transparent while ensuring the electron injecting property. Accordingly, the light transmittance on the side of the upper electrode of the organic layer is ensured sufficiently.

Further, due to the structure of disposing the buffer layer comprising the insulating material in contact with the organic layer, the buffer layer has the hole blocking property to the organic layer. Accordingly, holes can be confined to the organic layer. Further, since the electron injecting layer having a mixed layer is disposed above the buffer layer, an appropriate electron injecting property to the organic layer can be ensured by the electron injecting layer.

According to the organic electroluminescence device as described above, since the light transmittance is ensured on the side of the upper electrode of the organic layer, the intensity of light emission from the side of the upper electrode used as the cathode can be improved. Further, since the appropriate electron injecting efficiency from the upper electrode to the organic layer can be ensured and the hole blocking property to the organic layer can also be ensured, the light emission intensity and the light emission life can be improved.

DESCRIPTION OF THE ACCOMPANYING DRAWINGS

PREFERRED EMBODIMENTS OF THE INVENTION

Figure 1:
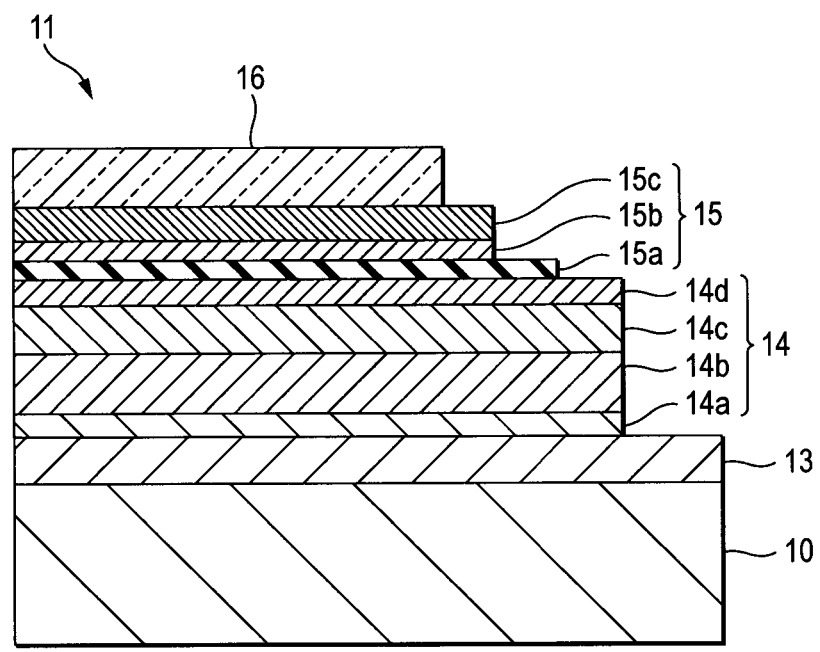
FIG. 1 is a schematic cross sectional view showing the structure of an organic electroluminescence device according to an embodiment of the invention.

An organic electroluminescence device and a display device according to preferred embodiments of the present invention are to be described specifically with reference to the drawings. FIG. 1 is a cross sectional view schematically showing an organic electroluminescence device of an embodiment according to the invention.

An organic electroluminescence device 11 shown in the drawing is disposed above a substrate 10. That is, in the organic electroluminescence device 11, a lower electrode 13, an organic layer 14, an electron injecting layer 15, and an upper electrode 16 are laminated successively above a substrate 10 and is adapted to take out light emission on the side of the upper electrode 16. In a display device using the organic electroluminescence device 11, a plurality of organic electroluminescence devices 11 are formed being arranged on every pixel on one identical substrate 10.

Detailed structures for the portions in the organic electroluminescence device 11 are to be described from the side of the substrate 10 successively.

At first, the substrate 10 is properly selected for use from transparent substrates such as made of glass, silicon substrates, and film-like flexible substrates. In a case where the operation system of a display device using the organic electroluminescence device 11 is an active matrix system, a TFT substrate in which TFT(s) are disposed on every pixels is used as the substrate 10. In this case, it is advantageous to use a display device of a top emission organic electroluminescence device 11 of taking out emission light only on the side opposite to the substrate 10 in view of the rate of opening for pixels. Further, each of the organic electroluminescence devices 11 has a structure of operating by using TFT in this case. In a case where the organic electroluminescence device 11 is a both side light emission type of taking out emission light also on the side of the substrate 10, the substrate 10 is formed of a material having light transmittance.

Then, for the lower electrode 13 used as an anode on the substrate 10, those having a high work function from the vacuum level of the electrode material, for example, chromium (Cr), gold (Au), alloy of tin oxide ($SnO_2$) and antimony (Sb), alloy of zinc oxide (ZnO) and aluminum (Al), as well as oxides of such metals or alloys can be used each alone or in admixture in order to efficiently inject holes.

Particularly, in a case where the organic electroluminescence device 11 is of a top emission type, it is possible to improve the efficiency of taking out light to the outside by high reflectance effect by forming the lower electrode 13 of a high reflectance material. As the electrode material, for example, an electrode mainly comprising Al, Ag, etc. is used preferably. It is also possible to enhance the charge injecting efficiency by disposing a transparent electrode material layer having high work function, for example, ITO on the high reflectance material layer.

In a case where the operation system for the display device using the organic electroluminescence device 11 is of an active matrix system, the lower electrode 13 is patterned on every pixels to which TFTs are disposed. Then, a not illustrated insulative film is disposed over the lower electrode 13 and the surface of the anode 13 for each of the pixels is exposed through the openings in the insulative film.

On the other hand, in a case where the organic electroluminescence device 11 is of a both side light emission type, the lower electrode 13 may be formed, for example, of a transparent electrode material such as ITO.

The organic layer 14 disposed above the lower electrode 13 described above is formed by laminating a hole injecting layer 14a, a hole transporting layer 14b, a light emission layer 14c, and an electron transporting layer 14d successively from the side of the lower electrode 13. There is no particular restriction on the materials for forming each of the layers and those materials used generally as the material for constituting each of the layers may be used.

For example, hole transporting materials such as benzidine derivatives, styrylamine derivatives, triphenylmethane derivatives, and hydrazone derivatives can be used for the hole transporting layer 14b. Further, organic materials such as perylene derivatives, coumalin derivatives, pyran dyes, and triphenylamine derivatives may be doped by a slight amount to the host material of the light emission layer 14c. Further, electron transporting materials such as Alq (quinolinol aluminum complex), phenanthroline derivatives, Anthraquinodimethane derivatives, diphenylquinone derivatives, oxadiazole derivatives, and perylene tetracarboxylic acid derivatives can be used for the electron transporting layer 14d.

Each of the layers 14a to 14d described above may also have other constituent factors. For example, the light emission layer 14d may also be an electron transporting light emission layer or a hole transporting light emission layer. In this case, the layer structure may be simplified by saving the electron transporting layer 14d or the hole transporting layer 14b particularly. Further, it is also possible to adopt a laminate structure for each of the layers 14a to 14d. For example, the light emission layer 14c may be a white light emission device formed of a blue light emission portion, a green light emission portion, and a red light emission portion. Further, it may adopt also a laminate structure in which each of the hole injecting layer 14a and the hole transporting layer 14b may have plural layers.

Each of the layers 14a to 14d forming the organic layer 14 described above can be prepared, for example, by a vacuum vapor deposition method or other method, for example, a spin coating method.

The buffer layer 15a disposed above the organic layer 14 comprises an insulative material. The buffer layer 15a has an electron injecting property. As the insulative material, oxides, composite oxides, silicates, carbonates, composite oxides, or halides of metal materials having electron charging property are used as the insulative material and, further, they may be used also as a mixture with enhanced stability. Then, it is important to select and use those materials of favorable light transmittance from such insulative materials.

As the metal material having the electron injecting property described above, metals having high electron injecting property (that is, low work function), for example, metals having a work function of 4.2 V or less are suitable and specific examples include, preferably, alkali metals such as lithium (Li), sodium (Na), potassium (K), and cesium (Cs), alkaline earth metals such as barium (Ba), calcium (Ca), strontium (Sr), beryllium (Be), and magnesium (Mg). In addition, they also include yttrium (Y), lanthanum (La), samarium (Sm), gadolinium (Gd), ytterbium (Yb), silver (Ag), aluminum (Al), indium (In), etc.

Specific examples of the insulative materials that form the buffer layer 15a described above include, for example, $Li_2O$ as lithium (Li) oxide and $Cs_2O$ as cesium (Cs) oxide and, further, mixtures of such oxides. In addition, they also include, for example, alkaline earth metals such as calcium (Ca) and barium (Ba) and alkali metals such as lithium (Li) and cesium (Cs) and, further, those metals having low work function such as indium (In), magnesium (Mg), and silver (Ag), as well as fluorides, oxides, and composite oxides of such metals, for example, oxysilicides and oxycarbides. Among them, LiF is used preferably since the electron injecting property is favorable and light transmittance is also high.

Since the buffer layer 15a gives a favorable electron injecting property in spite of the inherent insulative property when it is formed as a super thin film using an insulative material, the thickness thereof is preferably from 1 nm or less.

A mixed layer 15b and the protective layer 15c are laminated above the buffer layer 15a.

Among them, the mixed layer 15b comprises an organic material having an electron transporting property and a metal material having an electron injection property. For the organic material having the electron transporting property, the same material as that forming the electron transporting layer 14d in the organic layer 14 is used. Particularly, for a combination having an appropriate electron injecting property and capable of obtaining a sufficient light emission efficiency and a luminance half-decay life, it is preferred to use Alq as the organic material for the electron transporting layer 14d and the mixed layer 15b described above. Further, as the metal material having the electron injecting property, at least one of the metal materials having low work function described above is used suitably.

In the mixed layer 15b, the concentration of the metal material is, preferably, about from 0.1 to 10% by weight and by restricting the concentration of the metal material lower relative to the concentration of the organic molecule, a high light emission efficiency can be obtained while suppressing the light absorption or light reflection inherent to the metal and increasing the transmittance of the entire device.

Further, the protective layer 15c comprises a material having the charge transporting property. The protective layer 15c is formed by using at least one of metal materials having the electron charging property described above (particularly, metal materials having low work function described above) for forming the electron charging layer 15. Among them, since Mg is inexpensive and easy to handle with, it is used particularly preferably.

For the protective layer 15c, the metal materials described above may be used as an element, or may be used also as an alloy. Further, the layer may be formed of an oxide or halide of the metal material described above. Further, the layer may also be formed as a mixed layer by using an organic material together with at least one of the metal materials having low work function.

For example, in a case of the protective layer 15c comprising an alloy of metal materials, MgAg can be used. However, in a case of forming the protective layer 15c with an element of each of the metal materials or the alloys thereof, it is important to form the layer as such a super thin film as capable of ensuring the light transmittance. For example, in a case of forming the protective layer 15c by using MgAg exemplified above, the thickness of the protective layer 15c is restricted to about 3 nm or less, preferably, 2 nm. This ensures the light transmittance in the protective layer 15c. It is preferred that the metal material of low work function described above is contained by 95% by weight or more in the protective layer 15c. This is because the metal material such as Mg having low work function is liable to be oxidized and oxidized after film formation and, as a result, can ensure the light transmittance easily. Accordingly, in a case of using MgAg, a protective layer 15c of higher light transmittance can be obtained by incorporating 95% or more of Mg to Ag.

Further, in a case where the protective film 15c is a mixed layer of a metal material with low work function and an organic material, the metal material with low work function may be used as the element, alloy, oxide, or halide as described above. However, since the protective layer 15c also constitutes an electron injecting layer 15 as described above, it is preferred to ensure the electron injecting property to some extent. Accordingly, a metal material having an electron injecting property of about 10% or less is doped.

The organic material used for the protective layer 15c is not restricted to those having electron transporting property. That is, in the organic electroluminescence device 11, a main component for electron injection to the light emission layer 14c in the organic layer 14 is the electron transporting layer 14d of the organic layer 14 and the mixed layer 15b. Accordingly, the organic material used in the protective layer 15c may have either a hole transporting or electron transporting property.

In a case the organic material constituting the protective layer 15c has the electron transporting property, a material with high electron transporting property is preferably used in view of lower voltage of the organic electroluminescence device 11. That is, since the mixed layer 15b is not the main component for electron injection to the light emission layer 14c as described above, even in case the mixed layer 15b comprises an organic material with high electron transportability, the injection balance between the holes and the electrons to the light emission layer 14c is not lost. Accordingly, a material of higher electron moveability than that of the electron transporting layer 14d can be used as the organic material that forms the protective layer 15c, by which the voltage for the organic electroluminescence device 11 can be lowered.

As the organic material having such high electron transportability, a phenanthroline derivative is used suitably. Since the phenanthroline derivative has a high electron transportability, in a case of using the same for the electron transporting layer, the injection balance described above is lost to result in remarkable lowering in the luminance half-decay life.

Further, as the organic material forming the protective layer 15c, general host materials and hole transporting materials for the light emission layer 14c are used. An example of the host material is ADN (Anthracene Dinaphthyl). Further, an example of the hole transporting material is α-NPD (α-naphthyl phenyl diamine). Also in a case of using such materials, the organic electroluminescence device 11 can be provided with a sufficient light emitting efficiency and a luminance half-decay life.

In case the organic material constituting the protective layer 15c has a hole transporting property, the material of the following formula (1) and derivatives thereof are preferably used.

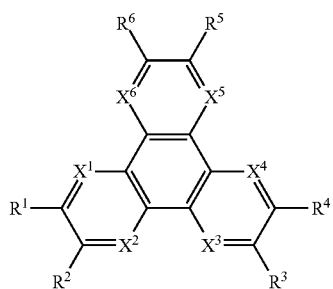

Formula (1)

In the formula (1), $R^1$ to $R^6$ each represents independently a hydrogen, halogen, hydroxyl group, amino group, arylamino group, substituted or not-substituted carbonyl group of 20 or less carbon atoms, substituted or not-substituted carbonyl ester group of 20 or less carbon atoms, substituted or not-substituted alkyl group of 20 or less carbon atoms, substituted or not-substituted alkenyl group of 20 or less carbon atoms, substituted or not-substituted alkoxyl group of 20 or less carbon atoms, substituted or not-substituted aryl group of 30 or less carbon atoms, substituted or not-substituted heterocyclic group of 30 or less carbon atoms, or substituent selected from nitrile group, cyano group, nitro group, or silyl group. Adjacent $R^m$ (m=1 to 6) may join to each other by way of a cyclic structure. Further, $X^1$ to $X^6$ in the formula (1) each represents independently a carbon or nitrogen atom.

One of specific examples of the organic materials represented by the formula (1) described above is, for example, a material of the following formula (2).

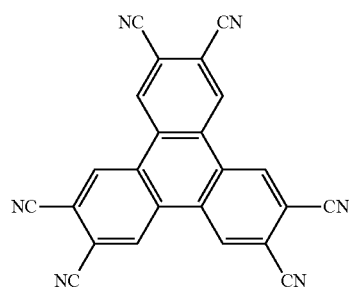

Formula (2)

By forming the protective layer 15c using the mixed layer comprising the organic material of the formula (1) or usual host material or hole transporting material for the light emission layer 14c, and the metal material of low work function, the light emission efficiency of the organic electroluminescence device is improved and long life can be obtained particularly.

In the electron injection layer 15, the thickness for each of the layers is set such that the transmittance at a wavelength region of from 440 to 700 nm is 85% or more.

Then, the upper electrode 16 disposed above the electron injection layer 15 is formed, for example, of a so-called transparent conductive film. The transparent conductive film is a transparent conductive film typically represented by Indium-Tin-Oxide and a mixture of indium oxide ($In_2O_3$) and zinc oxide (ZnO), that is, Indium-Zinc-Oxide (IZO: trade mark of Idemitsu Kosan Co.) and it is formed, for example, of IZO at a film thickness of about 50 nm.

The upper electrode 16 having such a transparent conductive film is formed by a sputtering method in an oxygen atmosphere.

The organic electroluminescence device 11 of this embodiment as has been described above has a structure in which a buffer layer 15a made of an insulative material, a mixed layer 15b, and a protective layer 15c are laminated in this order between the organic layer 14 and the upper electrode 16.

Among them, since the buffer layer 15a comprises an insulative material, a light transmittance can be ensured easily. Further, since the mixed layer 15b comprises an organic material and a metal material, the metal material reacts while reducing an organic material and becomes transparent while ensuring the electron injecting property. Further, in a case where the protective layer 15c consists only of a super thin film of the metal material, this is oxidized to become light permeable upon forming the upper electrode 16. On the other hand, in a case where the protective film 15c comprises an organic material and a metal material, the light transmittance is ensured inherently like the mixed layer 15b and, further, this is oxidized upon film formation of the upper electrode 16 to improve the light transmittance.

Accordingly, light transmittance of the organic layer 14 on the side of the upper electrode 16 can be ensured sufficiently. Further, since the buffer layer 15a comprising the insulative material is disposed in contact with the organic layer 14, the buffer layer 15a has a hole blocking property to the organic layer 14. Accordingly, holes can be confined to the organic layer 14.

Further, since the mixed layer 15b disposed on the buffer layer 15a is formed by using the metal material having the electron injection property, this serves as a main component for electron injection. A protective layer 15c having a charge transporting property is disposed on the mixed layer 15b. Thus, in an oxidative atmosphere upon forming the film of the upper electrode 16 having the transparent conductive film on the protective layer, the protective layer 15c functions as a protective film for preventing oxidation of the mixed layer 15b as a main component for electron injection. Accordingly, lowering of the electron injection efficiency by the oxidation of the mixed layer 15b is prevented.

From the foregoings, the electron injection efficiency from the electron injection layer 15 to the organic layer 14 can be maintained at an appropriate value.

As a result, according to the organic electroluminescence device 11 having the constitution as described above, since the light transmittance of the organic layer 14 on the side of the upper electrode 16 is ensured, the light emission intensity from the side of the upper electrode used as the cathode can be improved. In addition, since an appropriate electron injection efficiency from the upper electrode 16 to the organic layer 14 can be ensured and since the hole blocking property to the organic layer 14 can also be ensured, the light emission intensity and the emission life can be improved.

In the organic electroluminescence device 11 constructed as described above, in a case where the protective layer 15c is a mixed layer comprising the metal material and the organic material, the range for selecting the organic material to be used can be extended. That is, since it is necessary for the protective layer 15c to ensure the electron injection property to some extent, it is necessary to dope a metal material having an electron injection property of about 10% or less. However, the mixed layer 15b below the protective layer 15c mainly conducts electron injection to the light emission layer 14c. Accordingly, the organic material as the medium may be either hole transporting or electron transporting or may transport both of the charge. Accordingly, it is possible to form the protective layer 15c using an organic material having high electron transportability as the medium without considering the injection balance between electrons and holes to the organic layer 14, thereby obtaining an effect of lowering the operating voltage.

Then, since the protective layer 15c is constituted as described above, an organic material selected optimally can be used for the mixed layer 15b disposed therebelow while only considering to properly determine the amount of electrons to be injected into the light emission layer 14.

This enables to optimize the device property such that the operating voltage is decreased by using the protective layer 15c of high electron transportability while ensuring sufficient light emission efficiency and luminance half-decay life by properly selecting the organic material used for the mixed layer 15b and the protective layer 15c within a range of selection at high degree of freedom. In addition, the light transmittance of the device itself is not impaired.

The organic electroluminescence device 11 as has been described in the preferred embodiment can also be applied to a tandem organic electroluminescence device formed by laminating a unit (light emission unit) of the organic layer 14 having the light emission layer 14c.

In this structure, the upper electrode 16 formed of the transparent conductive film is disposed as a cathode by way of the electron injection layer 15 above the uppermost light emission unit.

Further, in the embodiment described above, the structure of the organic electroluminescence device 11 having the electron injection layer 15 of the three-layered structure has been explained. However, the organic electroluminescence device of the invention may also adopt a structure not provided with the protective layer 15c. Also in such a case, since the buffer layer 15a below the mixed layer 15b is formed by using a metal having the electron injection property and can provide the function of injecting electrons, the electron injection efficiency can be ensured to some extent. Further, the light transmittance and the hole blocking property can also be ensured.

EXAMPLE

In a Case of Single Light Emission Unit

Then, description is to be made for the procedures of manufacturing organic electroluminescence devices of actual Examples 1 to 6 of the invention and Comparative Examples 1 and 2 with reference to FIG. 1 and then the result of evaluation for them is to be described.

Example 1

In this example, an organic electroluminescence device in which the electron injection layer 15 has a two-layered structure was manufactured.

At first, an Ag—Pd—Cu layer was formed on a substrate of a glass plate sized 30 mm×30 mm and an ITO layer was formed thereon to form a lower electrode 13 of a two-layered structure as an anode. Subsequently, a film of $SiO_2$ was formed by sputtering and patterned by lithography to manufacture a cell for use in an organic electroluminescence device masked for a portion other than a 2 mm×2 mm light emission region with an insulative film (not illustrated):

Then, as the hole injection layer 14a, 2-TNATA (4,4',4"-tris(2-naphtylphenylamino)triphenylamine] was vapor deposited at a film thickness of 15 nm (vapor deposition rate: 0.2 to 0.4 mm/sec).

Then, an α-NPD (α-naphthyl phenyl diamine) was formed by vapor deposition at film thickness of 15 nm (vapor deposition rate: 0.2 to 0.4 nm/sec) as the hole transporting layer.

Then, the light emission layer 14c was vapor deposited at a film thickness of 32 nm in total using ADN (anthracene dinaphthyl) as a host material and BD-052x (manufactured by Idemitsu Kosan Co.) as a dopant such that the dopant concentration was 5.0% by weight.

Finally, Alq3 (8-hydroxy quinoline aluminum) was vapor deposited at a film thickness of 10 nm as the electron transporting layer 14d. Then, LiF was vapor deposited at a film thickness of 0.1 nm as the buffer layer 15a.

Successively, Alq and Mg at 100:5 weight ratio were formed at a 5 nm film thickness by co-vapor deposition as the mixed layer 15b. Further, as the protective layer 15c, the material represented by the following formula (2) and Mg were formed at a film thickness of 5 nm at 100:5 weight ratio by co-vapor deposition by a vacuum vapor deposition method. Thus, the electron injection layer 15 having two layers of the mixed layer 15b and the protective layer 15c was formed.

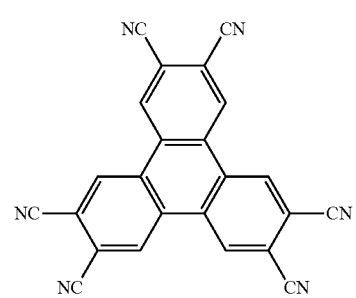

Formula (2)

Then, IZO was formed at a film thickness of 50 nm as the upper electrode 16 by a sputtering method.

With the procedures described above, the top emission organic electroluminescence device having the transparent conductive film as the upper electrode 16 of the cathode was manufactured.

Example 2

An organic electroluminescence device was manufactured in the same manufacturing procedures as those in Example 1 except for forming the protective layer 15c with an Mg—Ag alloy. In the formation of the protective layer 15c, the Mg—Ag alloy was co-vapor deposited to a film thickness of 2 nm at a weight ratio of Mg:Ag=100:5.

Example 3

An organic electroluminescence device was manufactured in the same manufacturing procedures as those in Example 1 except for forming the protective layer 15c as the mixed layer comprising α-NPD and Mg as the hole transporting material. In the formation of the protective layer 15c, the α-NPD-Mg alloy was co-vapor deposited at a film thickness of 5 nm at a weight ratio of α-NPD:Mg 100:5.

Example 4

An organic electroluminescence device was manufactured in the same manufacturing procedures as those in Example 1 except for forming the protective layer 15c as the mixed layer comprising ADN and Mg used usually as the host material for the light emission layer. In the formation of the protective layer 15c, ADN and Mg were co-vapor deposited at a film thickness of 5 nm at a weight ratio of ADN:Mg=100:5.

Example 5

An organic electroluminescence device was manufactured in the same manufacturing procedures as those in Example 1 except for forming the protective layer 15c as the mixed layer comprising BCP (basocuproin) as one of phenanthroline derivatives having extremely high electron transportability. In the formation of the protective layer 15c, the BCP and Mg were co-vapor deposited to a film thickness of 5 nm at a weight ratio of BCP:Mg=100:5.

Example 6

An organic electroluminescence device was manufactured in the same procedures as those in Example 1 except for forming the electron injection layer 15 with a mono-layered structure consisting only of the mixed layer 15b in the manufacturing procedures of Example 1. That is, in the manufacturing procedures in Example 1, after forming the mixed layer 15b, the upper electrode 16 was formed without forming the protective layer 15c.

Comparative Example 1

A top emission organic electroluminescence device was manufactured in the same manufacturing procedures as those in Example 6 except for saving the formation of the buffer layer 15a in Example 6.

Comparative Example 2

An organic electroluminescence device was manufactured in the same manufacturing procedures as those in Example 6 except for using BCP instead of Alq as the organic material forming the mixed layer 15b in the manufacturing procedure in Example 6. That is, this is an example in which the organic material forming the mixed layer 15b had a higher electron transportability than the electron transporting layer 14d (Alq) in the organic layer 14. In the formation of the mixed layer 15b, BCP and Mg were co-vapor deposited at a film thickness of 5 nm at a weight ratio of BCP:Mg=100:5.

Result of Evaluation

For the organic electroluminescence devices of Examples 1 to 6 and Comparative Examples 1 and 2 manufactured as described above, light emission efficiency, operating voltage, and transmittance were measured. The following Table 1 shows the result of the evaluation together with the layer structure of the electron injecting layer in the organic electroluminescence devices. The light emission efficiency (cd/A) of the organic electroluminescence device was a value measured upon application of a current at a density of 10 mA/cm$^2$.

TABLE 1

| | Electron injecting layer 15 | | | Light emitting efficiency (cd/A) | Operating voltage (V) | Transmittance (%) |
|---|---|---|---|---|---|---|
| | Buffer layer 15a | Mixed layer 15b | Protective layer 15c | | | |
| Example 1 | LiF | Alq-Mg | Formula (2)-MG | 3.7 | 5.67 | 85 or higher |
| Example 2 | " | " | Mg—Ag | 3.4 | 6.02 | 90 or higher |
| Example 3 | " | " | α NPD-Mg | 3.7 | 6.97 | 90 or higher |
| Example 4 | " | " | ADN-Mg | 3.7 | 5.96 | 90 or higher |
| Example 5 | " | " | BCP-Mg | 3.9 | 5.26 | 90 or higher |
| Example 6 | " | " | — | 2.9 | 7.85 | 90 or higher |
| Comp. Example 1 | — | " | — | 2.2 | 9.65 | 90 or higher |
| Comp. Example 2 | LiF | BCP-Mg | — | 3.9 | 5.02 | 90 or higher |

*: Light emission efficiency and operating voltage are those under operation at 10 mA/cm.

From the result shown in Table 1, it was confirmed that the light emission efficiency was improved and the operating voltage was lowered in the organic electroluminescence devices of Examples 1 to 6 having the laminate structure of the buffer layer 15a and the mixed layer 15b when compared with the organic electroluminescence device of Comparative Example 1 not having the electron injecting layer of such a laminate structure. Further, it was confirmed also for the light transmittance that a sufficient value as 85% or more could be ensured in Examples 1 to 6 with all the provision of the buffer layer 15a.

Figure 2:
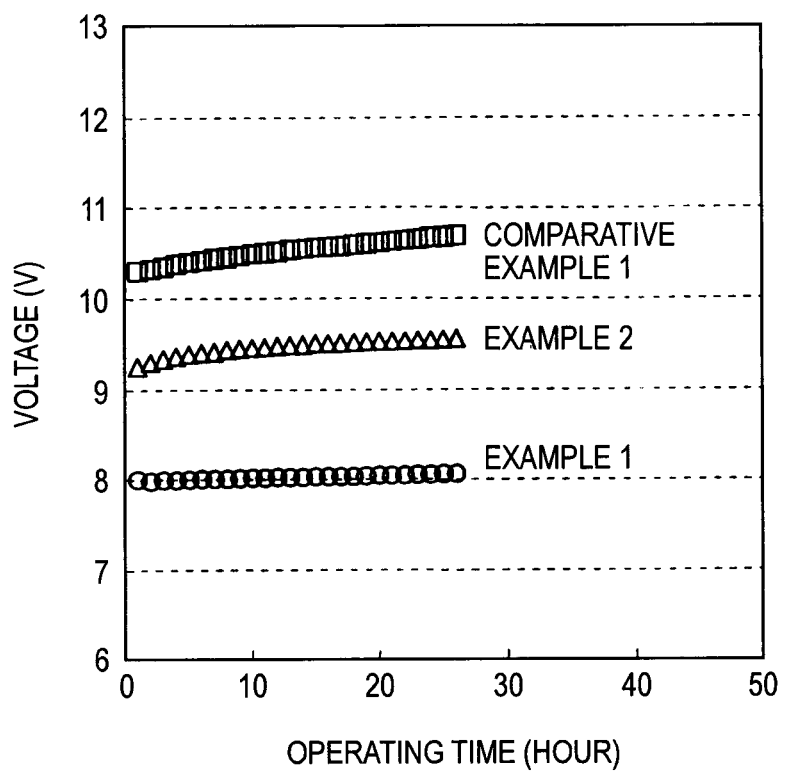
FIG. 2 is a graph showing a relation between an operating time and an operating voltage in an organic electroluminescence device of Examples 1, 2 and Comparative Example 1.

FIG. 2 shows the result of measuring the operating time-operating voltage for the organic electroluminescence devices of Examples 1 and 2, and Comparative Example 1. It can be seen also from the result that the operating voltage was lowered in the organic electroluminescence devices having the structure of Examples 1 and 2 as a preferred embodiment of the invention compared with the organic electroluminescence device of Comparative Example 1.

Further, it was confirmed for the organic electroluminescence devices of Example 1 to Example 5 provided with the protective layer 15c that the light emission efficiency could be improved and the operating voltage could be lowered when compared with the organic electroluminescence device of Example 6 not provided with the protective layer 15c. Thus, by providing the protective layer 15c it was confirmed that the effect capable of preventing the oxidation of the mixed layer 15b and keeping the electron injecting property in the mixed layer 15b.

Figure 3:
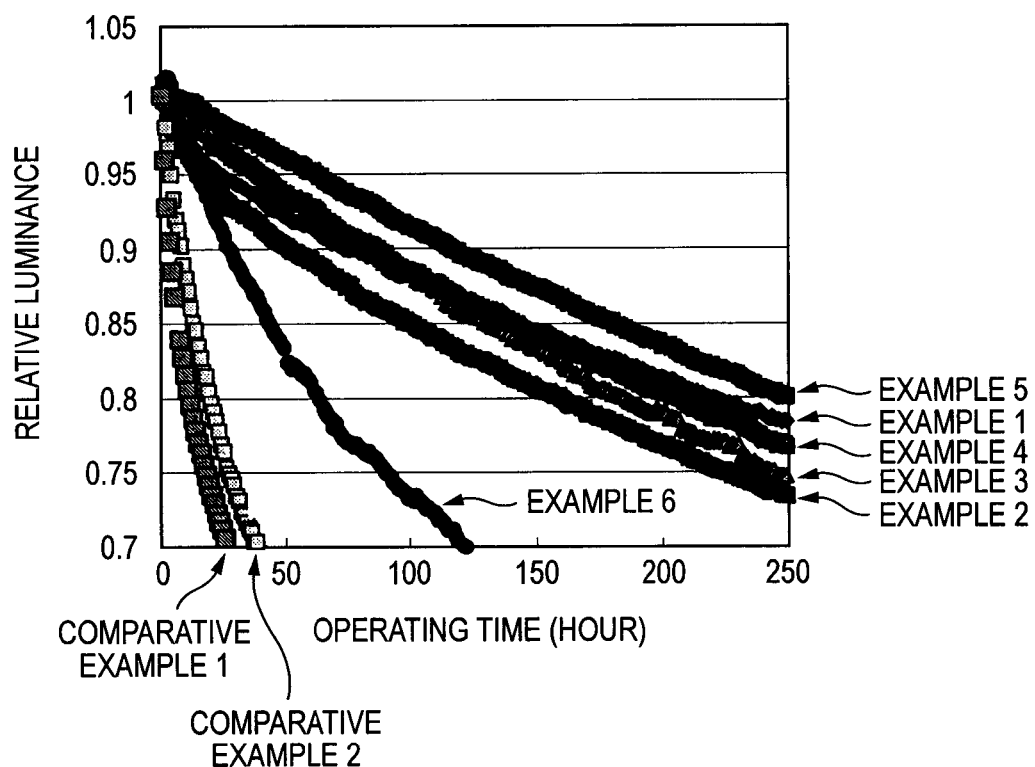
FIG. 3 is a graph showing a relation between an operating time and a relative luminance in an organic electroluminescence device of each of examples and comparative examples.

Then, FIG. 3 shows the result of measuring the relation for the operating time-relative luminance of the organic electroluminescence devices of Examples 1 to 6 and Comparative Examples 1, 2. From the result, it was confirmed that the light emission life was improved in the organic electroluminescence devices of Examples 1 to 6 having the laminate structure of the buffer layer 15a and the mixed layer 15b compared with the organic electroluminescence device of Comparative Example 1 not having such a laminate structure.

Further, it was confirmed for the organic electroluminescence devices of Examples 1 to 5 provided with the protective layer 15c on the mixed layer 15b that the light emission life was improved compared with the organic electroluminescence device of Example 6 not provided with the protective layer 15c. Also in view of the above, it was confirmed the effect capable of preventing the oxidation of the mixed layer 15b and maintaining the electron charging property in the mixed layer 15b by the provision of the protective layer 15c.

Further, as shown in FIG. 3, in the organic electroluminescence devices of Examples 1 to 5 in which the protective layers 15c were formed of respective materials, the rate of lowering the relative luminance was substantially identical. It can be seen from the foregoings that the kind of the organic materials used for the protective layer 15c gives scarce effects on the light emission life and the effect of prolonging the life by preventing oxidation of the electron injecting layer was predominant. On the contrary, Example 6 not provided with the protective film 15c showed the result that the life was remarkably shortened compared with Examples 1 to 5 by the effect of direct exposure of the Alq-Mg mixed alloy layer 15b having relatively lower electron transportability to the oxygen atmosphere.

Then, for the organic electroluminescence device shown in Comparative Example 2, it was confirmed from the result shown in Table 1 that the most advantageous effect was obtained for the light emission efficiency and the operating voltage, as well as a sufficient transmittance was obtained. Referring to the transmittance, this is because the transmittance was improved as a result of exposure of the upper electrode to an oxygen atmosphere during film formation by sputtering. However, no sufficient light emission life was obtained for Comparative Example 2. This is because appropriate balance between the hole and the electrons was lost by disposing BCP-Mg of extremely high electron transportability as the mixed layer 15b near the electron transporting layer 14d which greatly worsened the device life.

Then, with the foregoing results, it was confirmed that all of the device property required for the organic electroluminescence device 11, that is, the light emission efficiency, the operating voltage, and the light emission life could be ensured sufficiently by properly combining the mixed layer 15b for predominantly controlling the electron injecting property and the protective layer 15c for preventing the mixed layer 15b from being oxidized during film formation by sputtering of the upper electrode 16.

It was confirmed that a favorable organic electroluminescence device 11 can be obtained concerning all of the initial efficiency, the operating voltage, and the light emission life particularly by adopting the structure, for the electron injecting layer 15 disposed above the electron transporting layer 14d, that is, as a structure of laminating the mixed layer 15b having the same extent of electron transportability as that of the electron transporting layer 14d and the protective film 16b of higher electron transportability.

In a Case of Plural Light Emission Units

Figure 4:
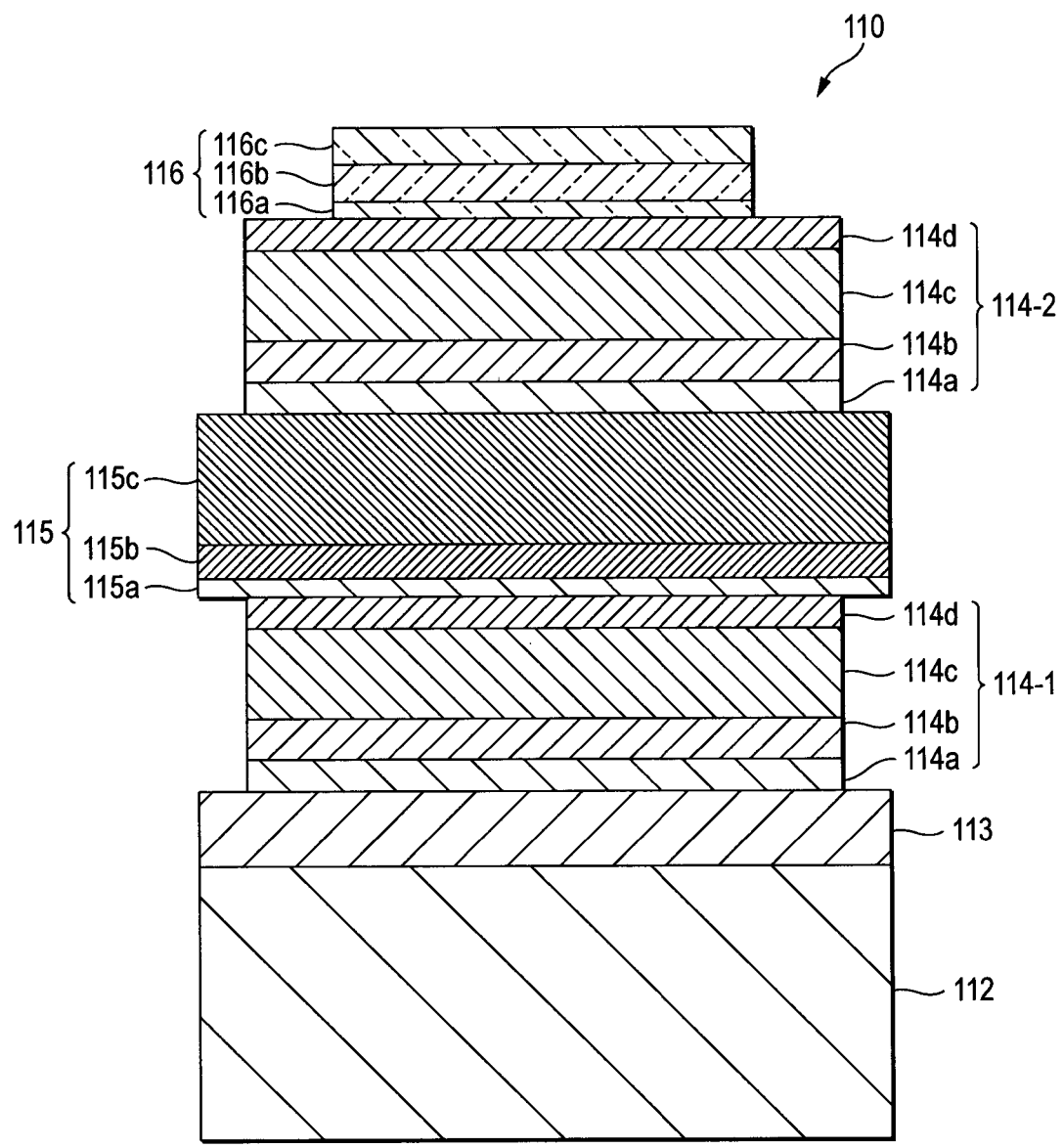
FIG. 4 is a schematic cross sectional view showing the structure of an organic electroluminescence device according to another embodiment of the invention.

Then, procedures for manufacturing tandem display devices including plural light emission units and the result of evaluation for them are to be explained. In the tandem display devices in another embodiment of the invention, a connection layer 115 disposed between the light emission units had an identical structure with that of the electron injecting layer 15 as described previously. Specifically, the connection layer had a laminate structure including a metal oxide layer, a charge transporting material layer, and a triphenylene layer. In Examples 1' to 24', a display device 110 shown in FIG. 4 was manufactured. In this case, the constitution of the connection layers 115 were respectively shown in the following Table 2. Examples of electron transporting materials in the charge transporting materials 115b forming the connection layer are shown by the formulae (1)-1 to (1)-42 in Table 2. Examples of the hole transporting materials are shown by the formulae (2)-1 to (2)-95 in Table 3.

TABLE 2

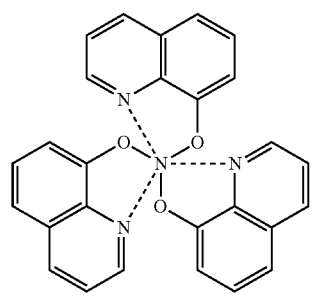

(1)-1

TABLE 2-continued
| | |
|---|---|
| 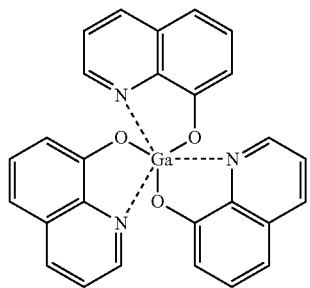 | (1)-2 |
| 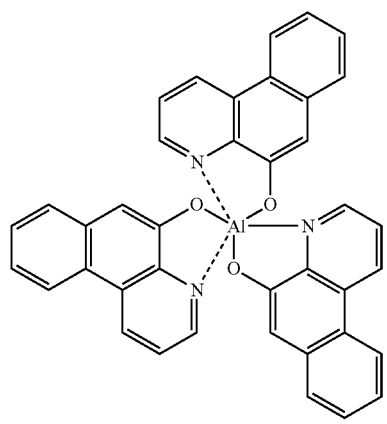 | (1)-3 |
| 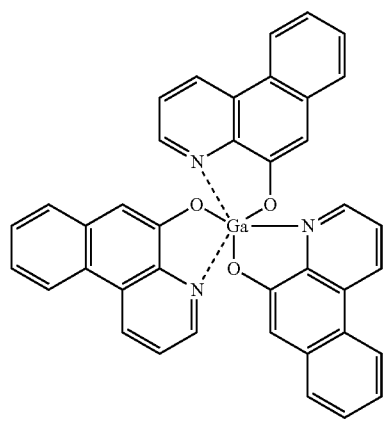 | (1)-4 |
| 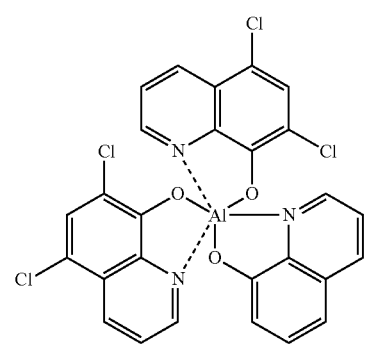 | (1)-5 |

TABLE 2-continued
| | |
|---|---|
| 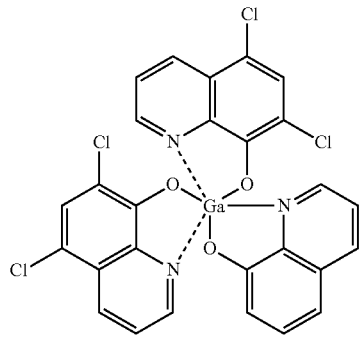 | (1)-6 |
| 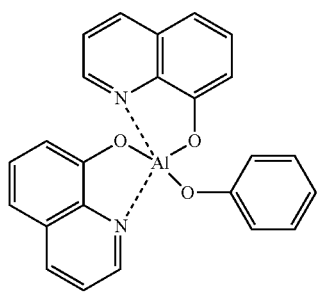 | (1)-7 |
| 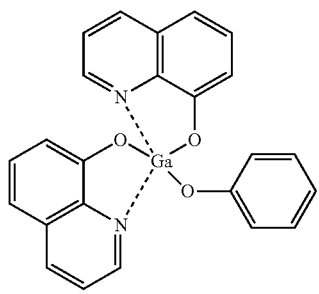 | (1)-8 |
| 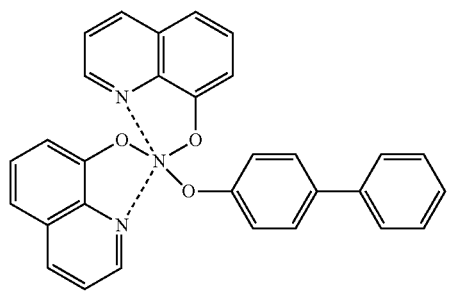 | (1)-9 |
| 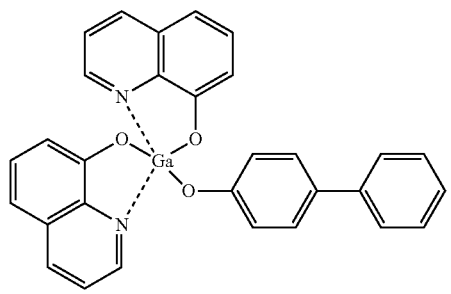 | (1)-10 |

TABLE 2-continued
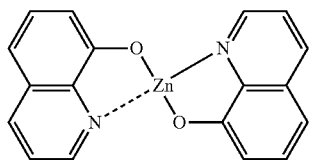 (1)-11
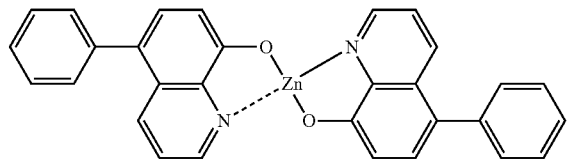 (1)-12
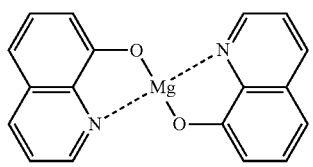 (1)-13
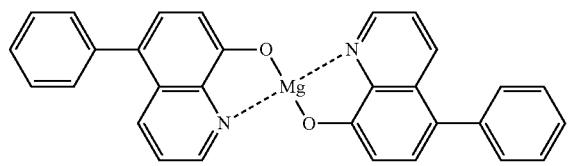 (1)-14
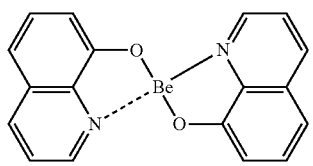 (1)-15
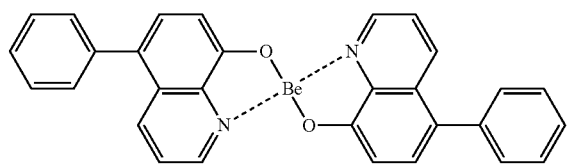 (1)-16
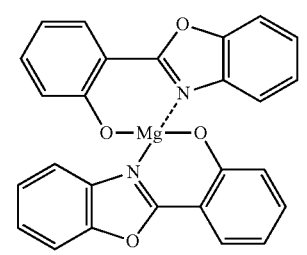 (1)-17
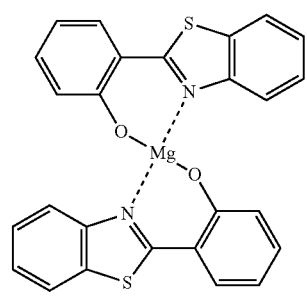 (1)-18

TABLE 2-continued
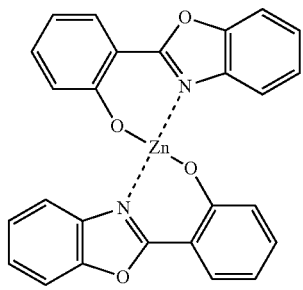
(1)-19
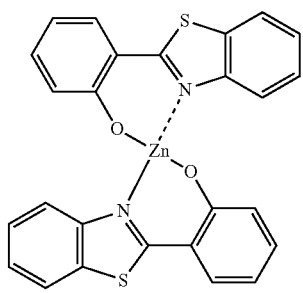
(1)-20
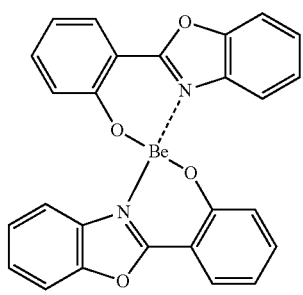
(1)-21
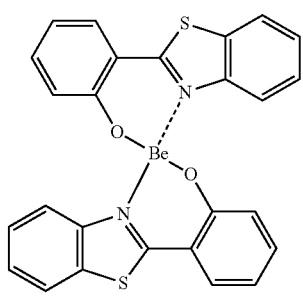
(1)-22
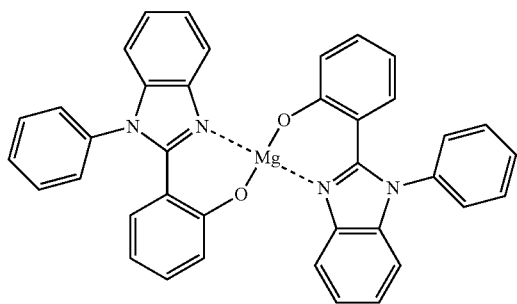
(1)-23

TABLE 2-continued
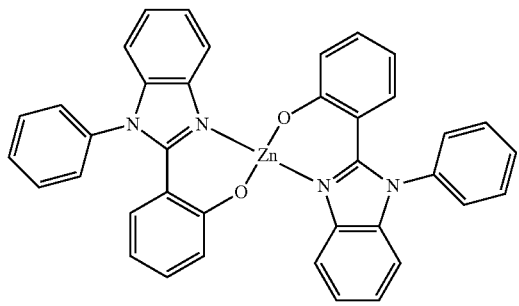
(1)-24
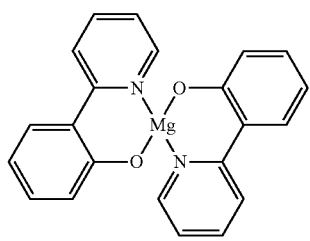
(1)-25
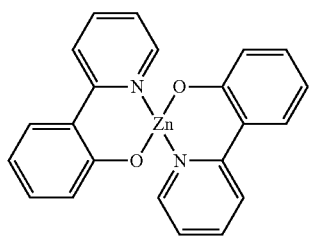
(1)-26
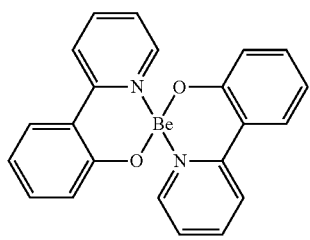
(1)-27
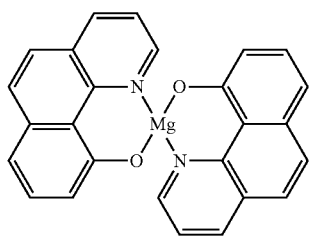
(1)-28
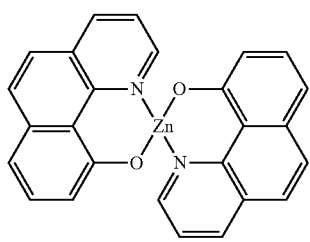
(1)-29

TABLE 2-continued
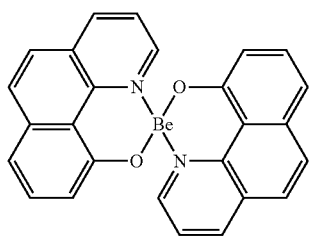
(1)-30
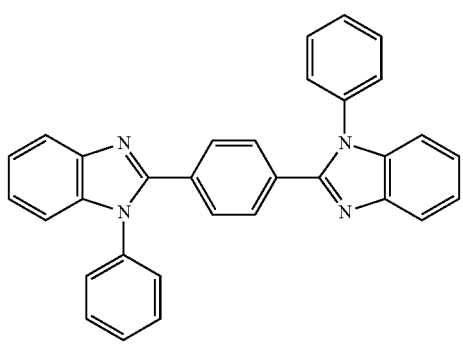 [SMILES: c1ccc(-n2c(-c3ccc(-c4nc5ccccc5n4-c4ccccc4)cc3)nc3ccccc32)cc1]
(1)-31
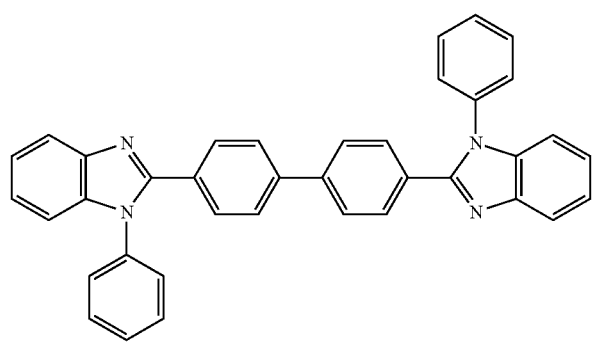 [SMILES: c1ccc(-n2c(-c3ccc(-c4ccc(-c5nc6ccccc6n5-c5ccccc5)cc4)cc3)nc3ccccc32)cc1]
(1)-32
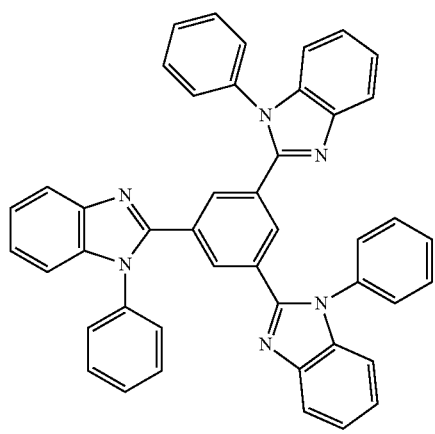 [SMILES: c1ccc(-n2c(-c3cc(-c4nc5ccccc5n4-c4ccccc4)cc(-c4nc5ccccc5n4-c4ccccc4)c3)nc3ccccc32)cc1]
(1)-33

TABLE 2-continued
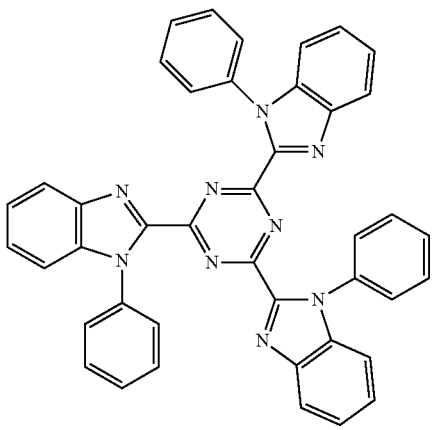 [SMILES: c1ccc(-n2c(-c3nc(-c4nc5ccccc5n4-c4ccccc4)nc(-c4nc5ccccc5n4-c4ccccc4)n3)nc3ccccc32)cc1]
(1)-34
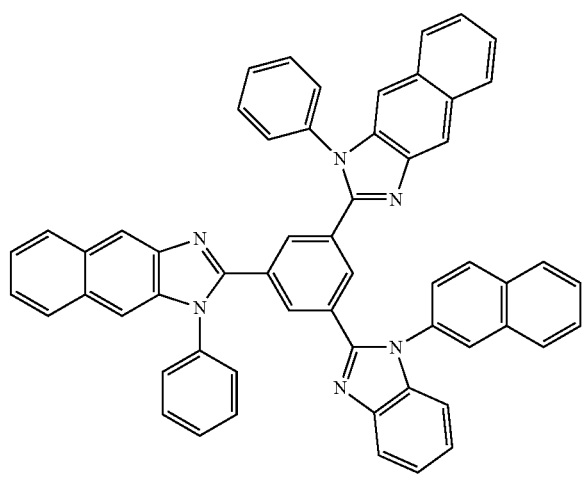 [SMILES: c1ccc(-n2c(-c3cc(-c4nc5ccccc5n4-c4ccc5ccccc5c4)cc(-c4nc5cc6ccccc6cc5n4-c4ccccc4)c3)nc3cc4ccccc4cc32)cc1]
(1)-35
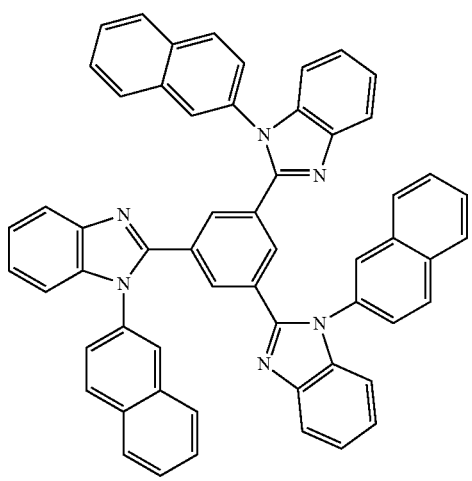 [SMILES: c1ccc2cc(-n3c(-c4cc(-c5nc6ccccc6n5-c5ccc6ccccc6c5)cc(-c5nc6ccccc6n5-c5ccc6ccccc6c5)c4)nc4ccccc43)ccc2c1]
(1)-36
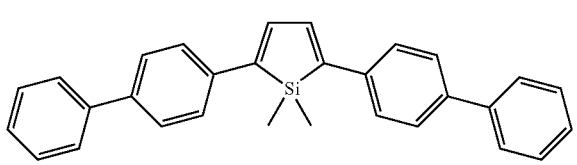 [SMILES: C[Si]1(C)C(c2ccc(-c3ccccc3)cc2)=CC=C1c1ccc(-c2ccccc2)cc1]
(1)-37

TABLE 2-continued
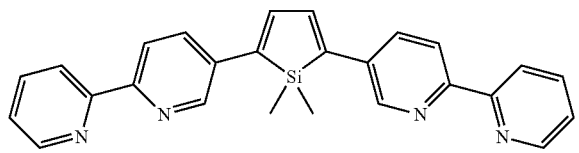 [SMILES: C[Si]1(C)C(c2ccc(-c3ccccn3)nc2)=CC=C1c1ccc(-c2ccccn2)nc1]
(1)-38
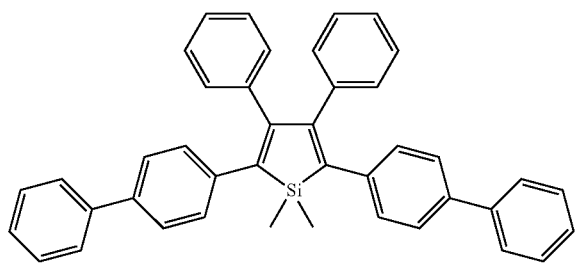 [SMILES: C[Si]1(C)C(c2ccc(-c3ccccc3)cc2)=C(c2ccccc2)C(c2ccccc2)=C1c1ccc(-c2ccccc2)cc1]
(1)-39
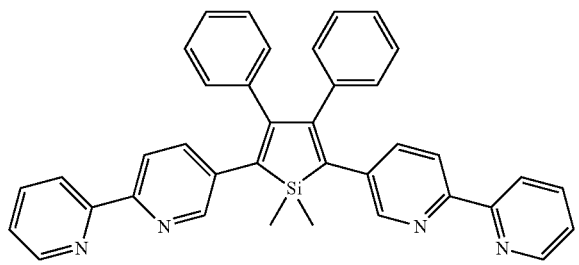 [SMILES: C[Si]1(C)C(c2ccc(-c3ccccn3)nc2)=C(c2ccccc2)C(c2ccccc2)=C1c1ccc(-c2ccccn2)nc1]
(1)-40
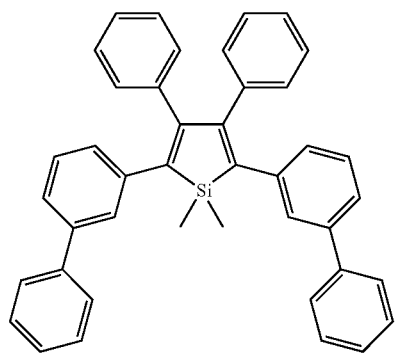 [SMILES: C[Si]1(C)C(c2cccc(-c3ccccc3)c2)=C(c2ccccc2)C(c2ccccc2)=C1c1cccc(-c2ccccc2)c1]
(1)-41
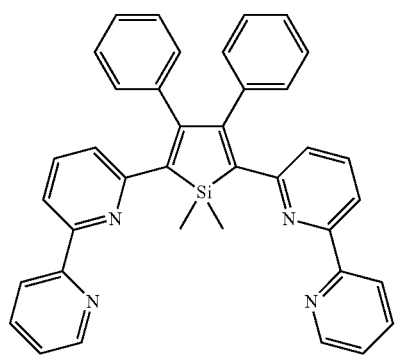 [SMILES: C[Si]1(C)C(c2cccc(-c3ccccn3)n2)=C(c2ccccc2)C(c2ccccc2)=C1c1cccc(-c2ccccn2)n1]
(1)-42

TABLE 3
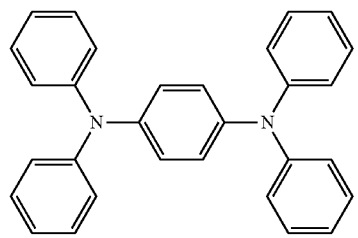 [SMILES: c1ccc(N(c2ccccc2)c2ccc(N(c3ccccc3)c3ccccc3)cc2)cc1]
(2)-1
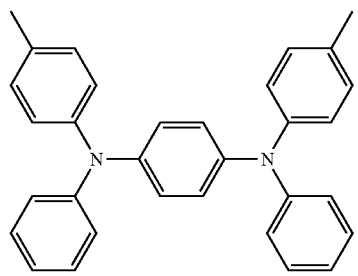 [SMILES: Cc1ccc(N(c2ccccc2)c2ccc(N(c3ccccc3)c3ccc(C)cc3)cc2)cc1]
(2)-2
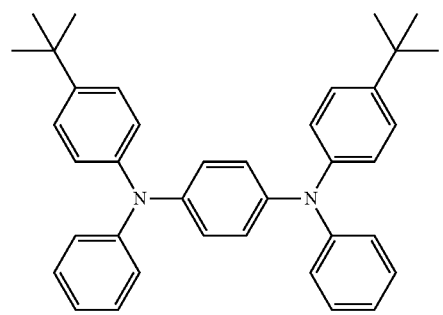 [SMILES: CC(C)(C)c1ccc(N(c2ccccc2)c2ccc(N(c3ccccc3)c3ccc(C(C)(C)C)cc3)cc2)cc1]
(2)-3
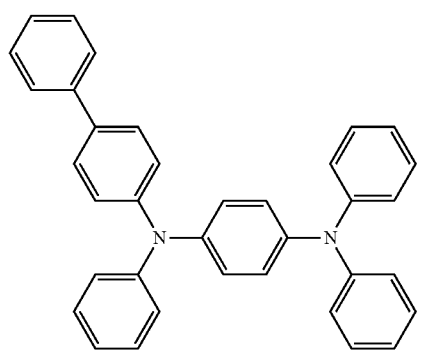 [SMILES: c1ccc(-c2ccc(N(c3ccccc3)c3ccc(N(c4ccccc4)c4ccccc4)cc3)cc2)cc1]
(2)-4
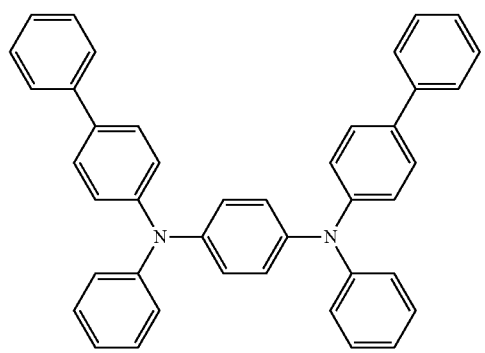 [SMILES: c1ccc(-c2ccc(N(c3ccccc3)c3ccc(N(c4ccccc4)c4ccc(-c5ccccc5)cc4)cc3)cc2)cc1]
(2)-5

TABLE 3-continued
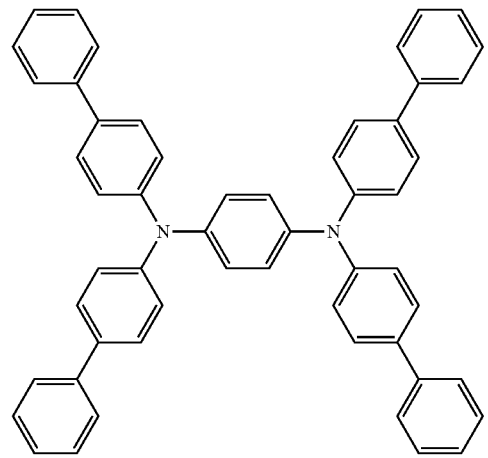 [SMILES: c1ccc(-c2ccc(N(c3ccc(-c4ccccc4)cc3)c3ccc(N(c4ccc(-c5ccccc5)cc4)c4ccc(-c5ccccc5)cc4)cc3)cc2)cc1]
(2)-6
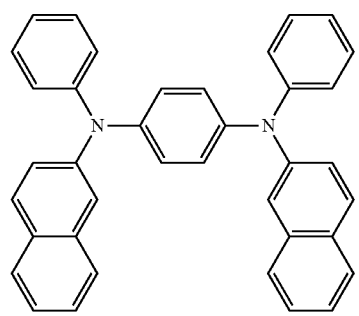 [SMILES: c1ccc(N(c2ccc(N(c3ccccc3)c3ccc4ccccc4c3)cc2)c2ccc3ccccc3c2)cc1]
(2)-7
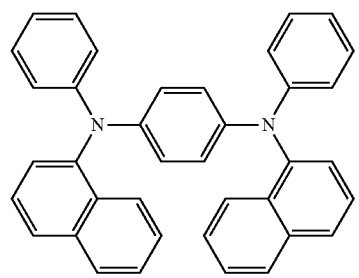
(2)-8
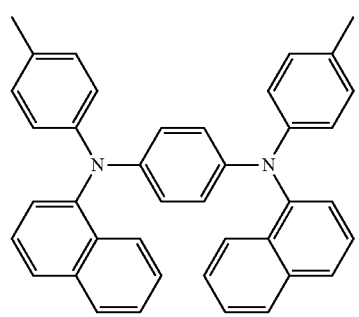 [SMILES: Cc1ccc(N(c2ccc(N(c3ccc(C)cc3)c3cccc4ccccc34)cc2)c2cccc3ccccc23)cc1]
(2)-9

TABLE 3-continued
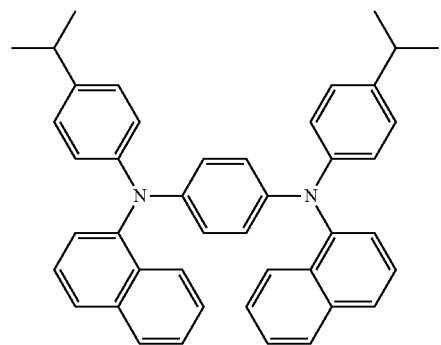 [SMILES: CC(C)c1ccc(N(c2ccc(N(c3ccc(C(C)C)cc3)c3cccc4ccccc34)cc2)c2cccc3ccccc23)cc1]
(2)-10
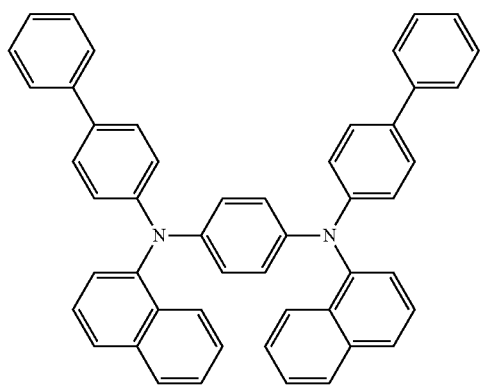 [SMILES: c1ccc(-c2ccc(N(c3ccc(N(c4ccc(-c5ccccc5)cc4)c4cccc5ccccc45)cc3)c3cccc4ccccc34)cc2)cc1]
(2)-11
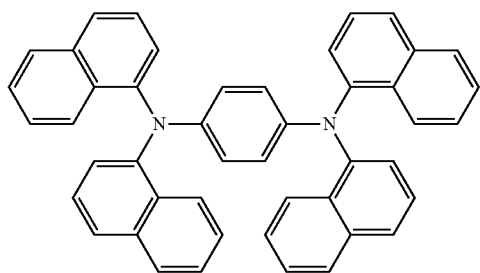 [SMILES: c1ccc2c(N(c3ccc(N(c4cccc5ccccc45)c4cccc5ccccc45)cc3)c3cccc4ccccc34)cccc2c1]
(2)-12
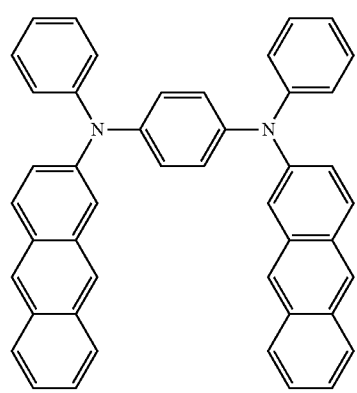 [SMILES: c1ccc(N(c2ccc(N(c3ccccc3)c3ccc4cc5ccccc5cc4c3)cc2)c2ccc3cc4ccccc4cc3c2)cc1]
(2)-13

TABLE 3-continued
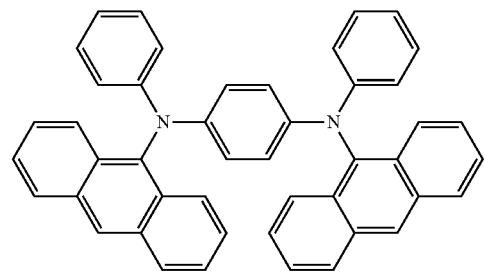 [SMILES: c1ccc(N(c2ccc(N(c3ccccc3)c3c4ccccc4cc4ccccc34)cc2)c2c3ccccc3cc3ccccc23)cc1]
(2)-14
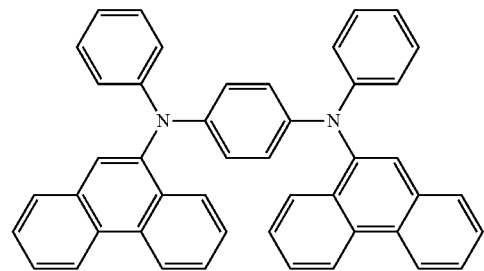 [SMILES: c1ccc(N(c2ccc(N(c3ccccc3)c3cc4ccccc4c4ccccc34)cc2)c2cc3ccccc3c3ccccc23)cc1]
(2)-15
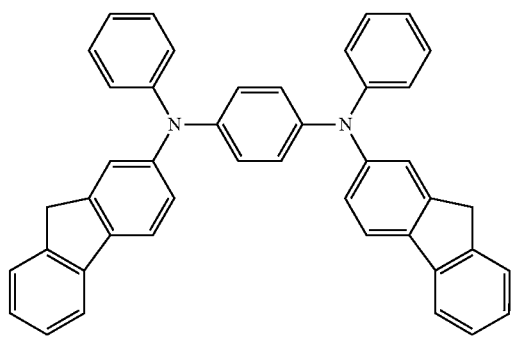 [SMILES: c1ccc(N(c2ccc(N(c3ccccc3)c3ccc4c(c3)Cc3ccccc3-4)cc2)c2ccc3c(c2)Cc2ccccc2-3)cc1]
(2)-16
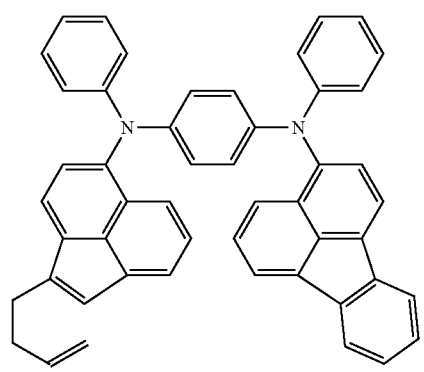 [SMILES: C=CCCC1=Cc2cccc3c(N(c4ccccc4)c4ccc(N(c5ccccc5)c5ccc6c7c(cccc57)-c5ccccc5-6)cc4)ccc1c23]
(2)-17
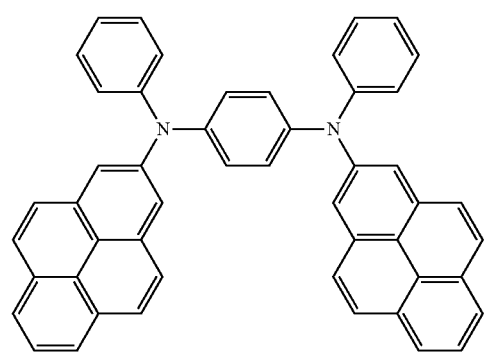 [SMILES: c1ccc(N(c2ccc(N(c3ccccc3)c3cc4ccc5cccc6ccc(c3)c4c56)cc2)c2cc3ccc4cccc5ccc(c2)c3c45)cc1]
(2)-18

TABLE 3-continued
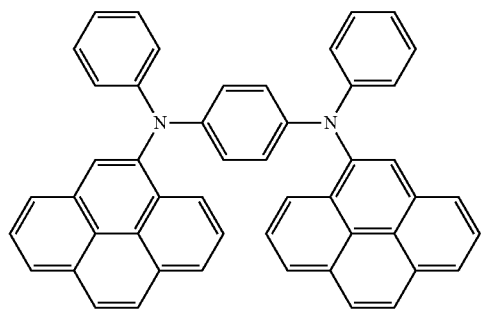 [SMILES: c1ccc(N(c2ccc(N(c3ccccc3)c3cc4cccc5ccc6cccc3c6c54)cc2)c2cc3cccc4ccc5cccc2c5c43)cc1]
(2)-19
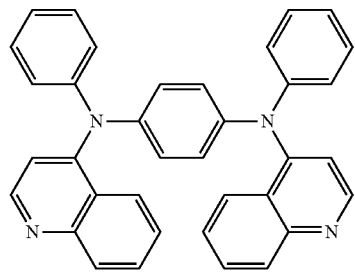 [SMILES: c1ccc(N(c2ccc(N(c3ccccc3)c3ccnc4ccccc34)cc2)c2ccnc3ccccc23)cc1]
(2)-20
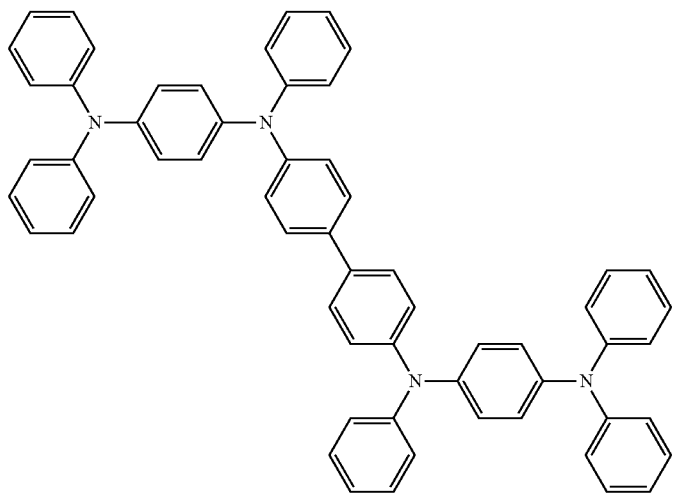 [SMILES: c1ccc(N(c2ccccc2)c2ccc(N(c3ccccc3)c3ccc(-c4ccc(N(c5ccccc5)c5ccc(N(c6ccccc6)c6ccccc6)cc5)cc4)cc3)cc2)cc1]
(2)-21
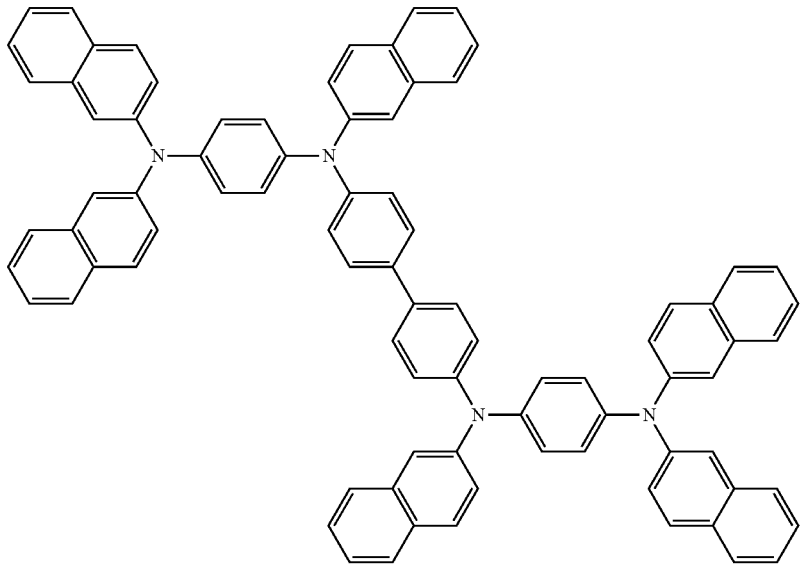 [SMILES: c1ccc2cc(N(c3ccc(-c4ccc(N(c5ccc(N(c6ccc7ccccc7c6)c6ccc7ccccc7c6)cc5)c5ccc6ccccc6c5)cc4)cc3)c3ccc(N(c4ccc5ccccc5c4)c4ccc5ccccc5c4)cc3)ccc2c1]
(2)-22

TABLE 3-continued
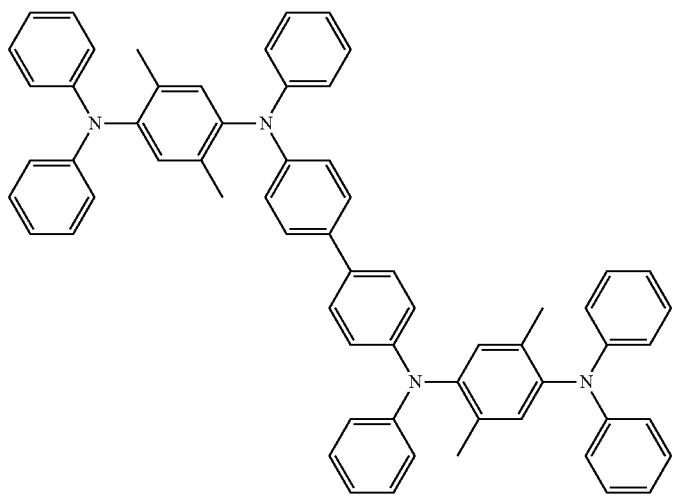 [SMILES: Cc1cc(N(c2ccccc2)c2ccc(-c3ccc(N(c4ccccc4)c4cc(C)c(N(c5ccccc5)c5ccccc5)cc4C)cc3)cc2)c(C)cc1N(c1ccccc1)c1ccccc1]
(2)-23
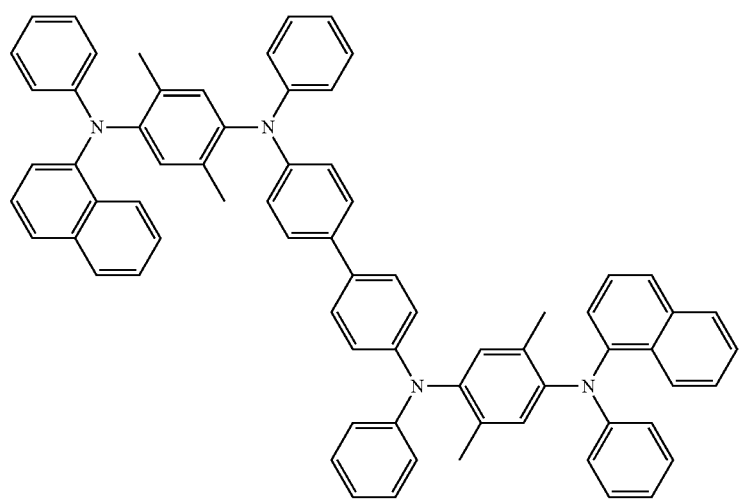 [SMILES: Cc1cc(N(c2ccccc2)c2cccc3ccccc23)c(C)cc1N(c1ccccc1)c1ccc(-c2ccc(N(c3ccccc3)c3cc(C)c(N(c4ccccc4)c4cccc5ccccc45)cc3C)cc2)cc1]
(2)-24
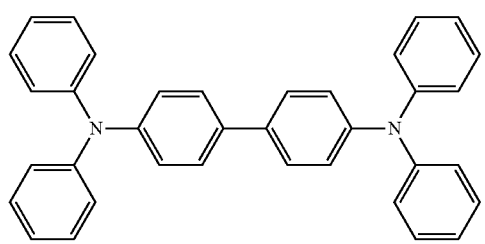 [SMILES: c1ccc(N(c2ccccc2)c2ccc(-c3ccc(N(c4ccccc4)c4ccccc4)cc3)cc2)cc1]
(2)-25
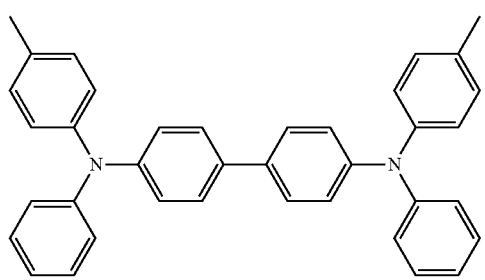 [SMILES: Cc1ccc(N(c2ccccc2)c2ccc(-c3ccc(N(c4ccccc4)c4ccc(C)cc4)cc3)cc2)cc1]
(2)-26

TABLE 3-continued
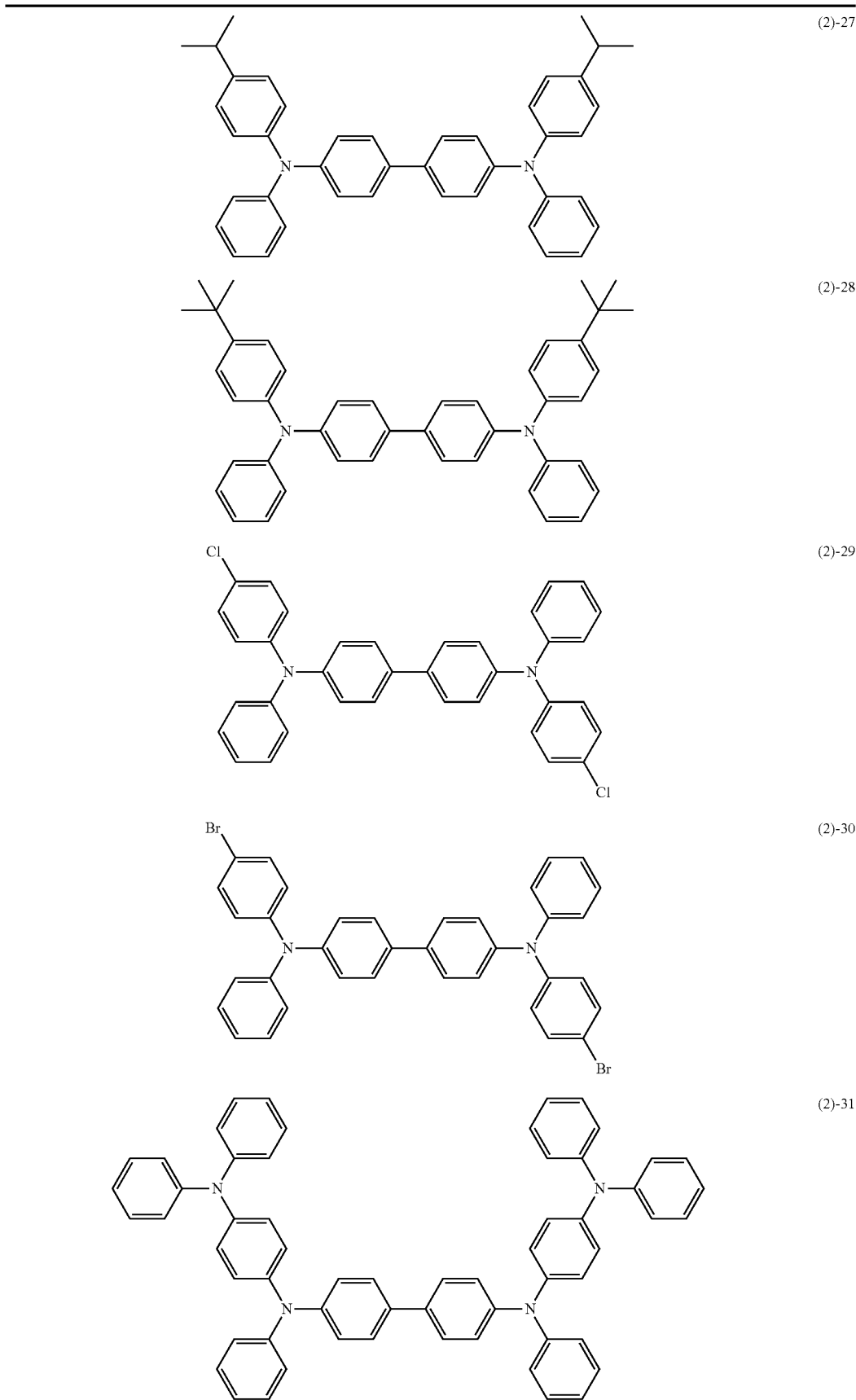
(2)-27
(2)-28
(2)-29
(2)-30
(2)-31

TABLE 3-continued
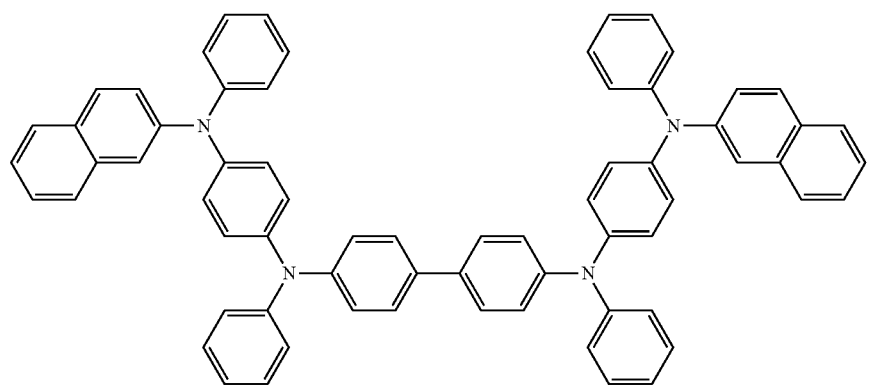 [SMILES: c1ccc(N(c2ccc(-c3ccc(N(c4ccccc4)c4ccc(N(c5ccccc5)c5ccc6ccccc6c5)cc4)cc3)cc2)c2ccc(N(c3ccccc3)c3ccc4ccccc4c3)cc2)cc1]
(2)-32
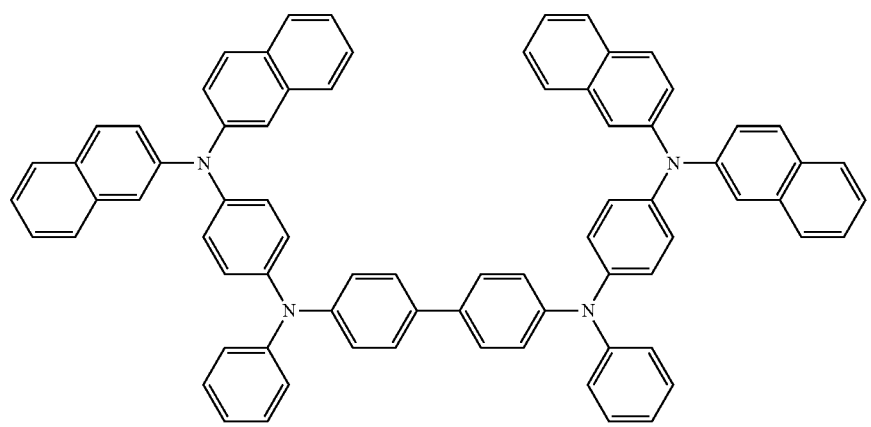 [SMILES: c1ccc(N(c2ccc(-c3ccc(N(c4ccccc4)c4ccc(N(c5ccc6ccccc6c5)c5ccc6ccccc6c5)cc4)cc3)cc2)c2ccc(N(c3ccc4ccccc4c3)c3ccc4ccccc4c3)cc2)cc1]
(2)-33
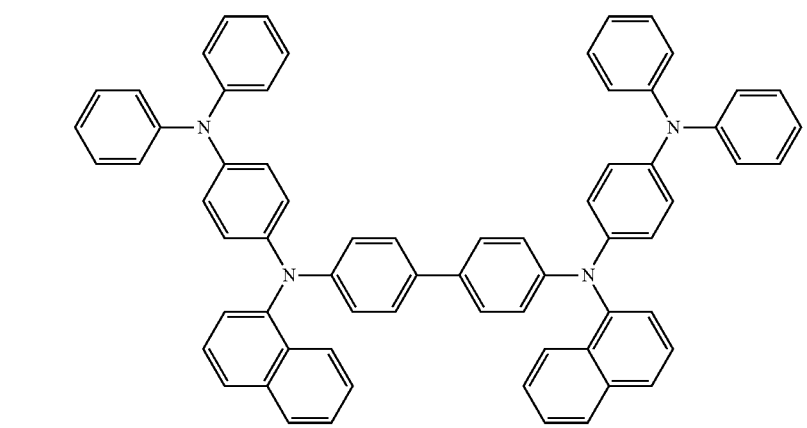 [SMILES: c1ccc(N(c2ccccc2)c2ccc(N(c3ccc(-c4ccc(N(c5ccc(N(c6ccccc6)c6ccccc6)cc5)c5cccc6ccccc56)cc4)cc3)c3cccc4ccccc34)cc2)cc1]
(2)-34

TABLE 3-continued
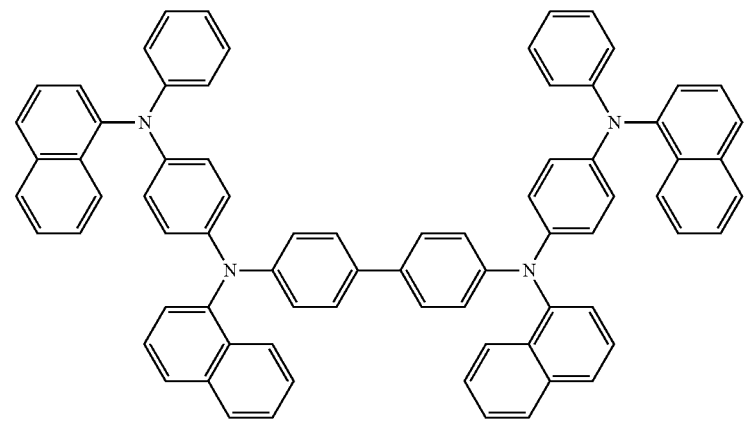 [SMILES: c1ccc(N(c2ccc(N(c3ccc(-c4ccc(N(c5ccc(N(c6ccccc6)c6cccc7ccccc67)cc5)c5cccc6ccccc56)cc4)cc3)c3cccc4ccccc34)cc2)c2cccc3ccccc23)cc1]
(2)-35
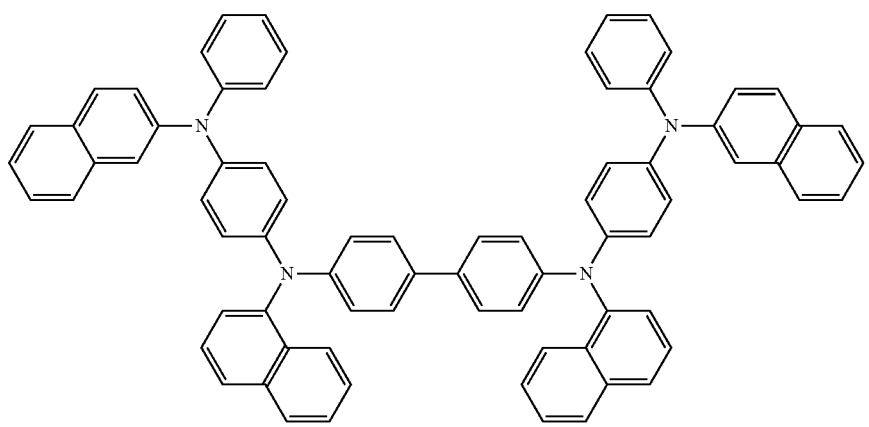 [SMILES: c1ccc(N(c2ccc(N(c3ccc(-c4ccc(N(c5ccc(N(c6ccccc6)c6ccc7ccccc7c6)cc5)c5cccc6ccccc56)cc4)cc3)c3cccc4ccccc34)cc2)c2ccc3ccccc3c2)cc1]
(2)-36
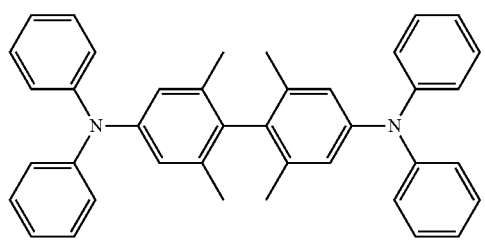 [SMILES: Cc1cc(N(c2ccccc2)c2ccccc2)cc(C)c1-c1c(C)cc(N(c2ccccc2)c2ccccc2)cc1C]
(2)-37
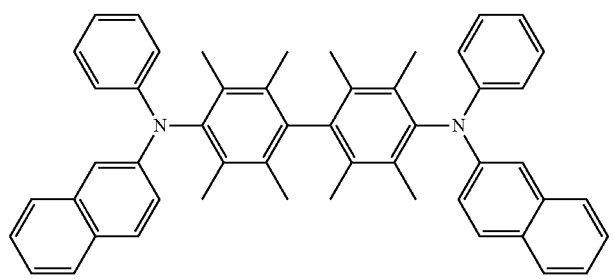 [SMILES: Cc1c(C)c(N(c2ccccc2)c2ccc3ccccc3c2)c(C)c(C)c1-c1c(C)c(C)c(N(c2ccccc2)c2ccc3ccccc3c2)c(C)c1C]
(2)-38
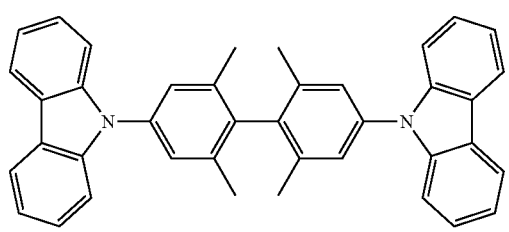 [SMILES: Cc1cc(-n2c3ccccc3c3ccccc32)cc(C)c1-c1c(C)cc(-n2c3ccccc3c3ccccc32)cc1C]
(2)-39

TABLE 3-continued
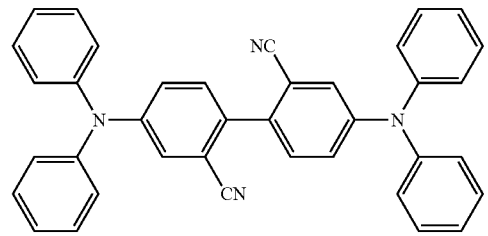 [SMILES: N#Cc1cc(N(c2ccccc2)c2ccccc2)ccc1-c1ccc(N(c2ccccc2)c2ccccc2)cc1C#N]
(2)-40
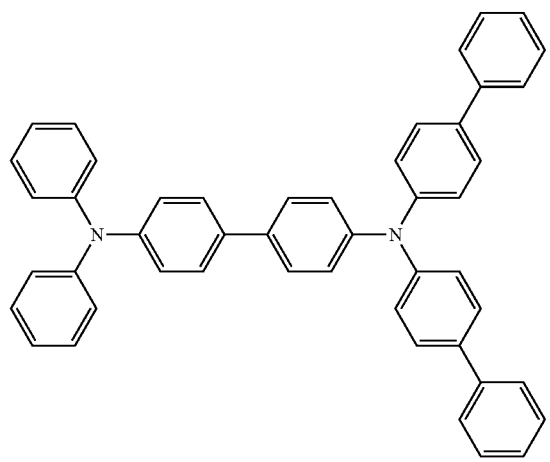 [SMILES: c1ccc(-c2ccc(N(c3ccc(-c4ccccc4)cc3)c3ccc(-c4ccc(N(c5ccccc5)c5ccccc5)cc4)cc3)cc2)cc1]
(2)-41
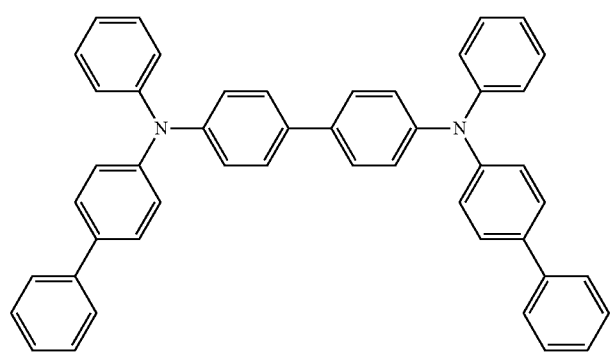 [SMILES: c1ccc(-c2ccc(N(c3ccccc3)c3ccc(-c4ccc(N(c5ccccc5)c5ccc(-c6ccccc6)cc5)cc4)cc3)cc2)cc1]
(2)-42
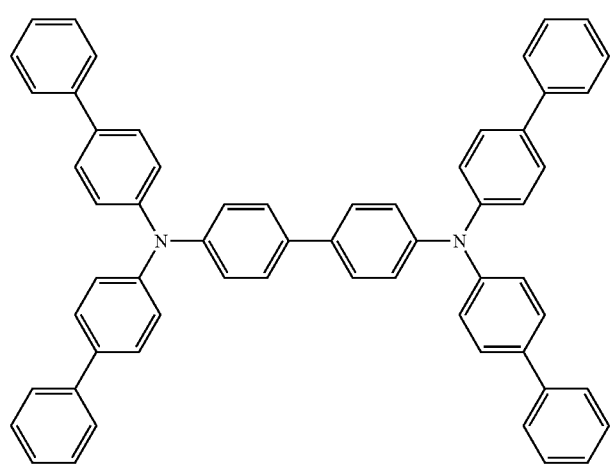 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]
(2)-43

TABLE 3-continued
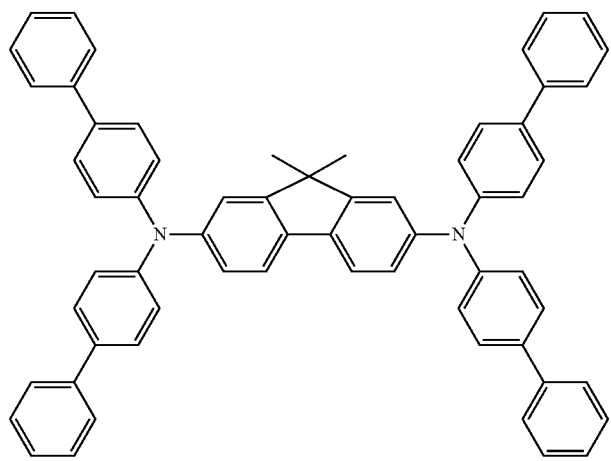 [SMILES: CC1(C)c2cc(N(c3ccc(-c4ccccc4)cc3)c3ccc(-c4ccccc4)cc3)ccc2-c2ccc(N(c3ccc(-c4ccccc4)cc3)c3ccc(-c4ccccc4)cc3)cc21]
(2)-44
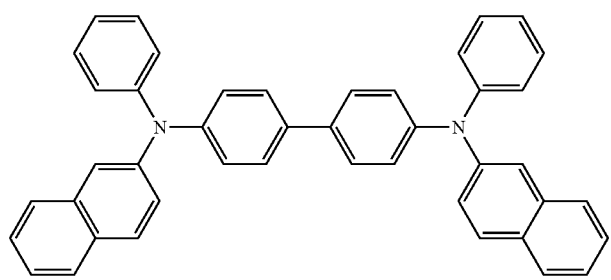 [SMILES: c1ccc(N(c2ccc(-c3ccc(N(c4ccccc4)c4ccc5ccccc5c4)cc3)cc2)c2ccc3ccccc3c2)cc1]
(2)-45
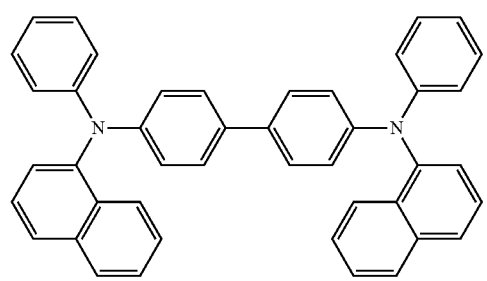 [SMILES: c1ccc(N(c2ccc(-c3ccc(N(c4ccccc4)c4cccc5ccccc45)cc3)cc2)c2cccc3ccccc23)cc1]
(2)-46
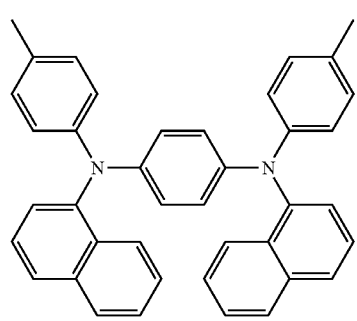 [SMILES: Cc1ccc(N(c2ccc(N(c3ccc(C)cc3)c3cccc4ccccc34)cc2)c2cccc3ccccc23)cc1]
(2)-47

TABLE 3-continued
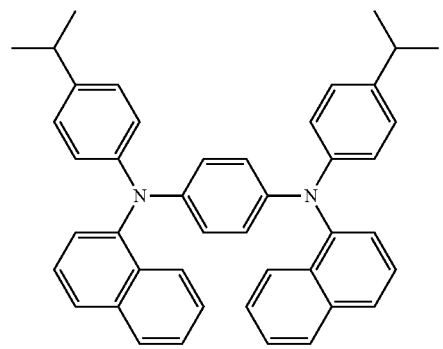 [SMILES: CC(C)c1ccc(N(c2ccc(N(c3ccc(C(C)C)cc3)c3cccc4ccccc34)cc2)c2cccc3ccccc23)cc1]
(2)-48
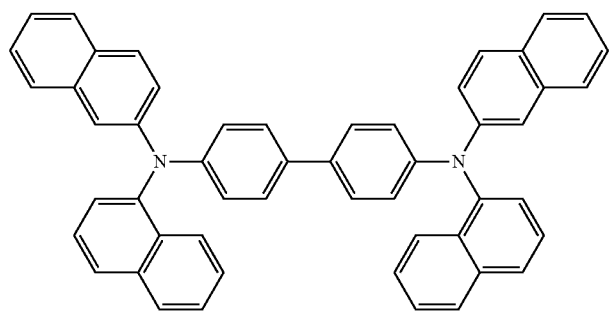 [SMILES: c1ccc2cc(N(c3ccc(-c4ccc(N(c5ccc6ccccc6c5)c5cccc6ccccc56)cc4)cc3)c3cccc4ccccc34)ccc2c1]
(2)-49
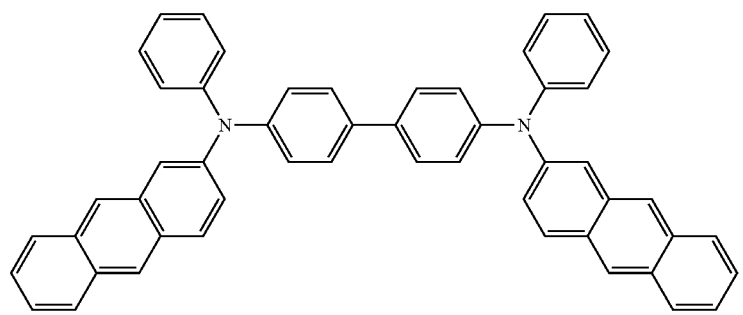 [SMILES: c1ccc(N(c2ccc(-c3ccc(N(c4ccccc4)c4ccc5cc6ccccc6cc5c4)cc3)cc2)c2ccc3cc4ccccc4cc3c2)cc1]
(2)-50
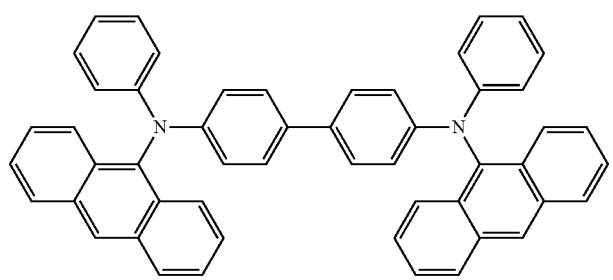 [SMILES: c1ccc(N(c2ccc(-c3ccc(N(c4ccccc4)c4c5ccccc5cc5ccccc45)cc3)cc2)c2c3ccccc3cc3ccccc23)cc1]
(2)-51
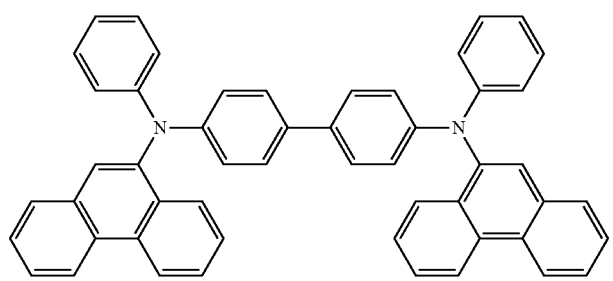 [SMILES: c1ccc(N(c2ccc(-c3ccc(N(c4ccccc4)c4cc5ccccc5c5ccccc45)cc3)cc2)c2cc3ccccc3c3ccccc23)cc1]
(2)-52

TABLE 3-continued
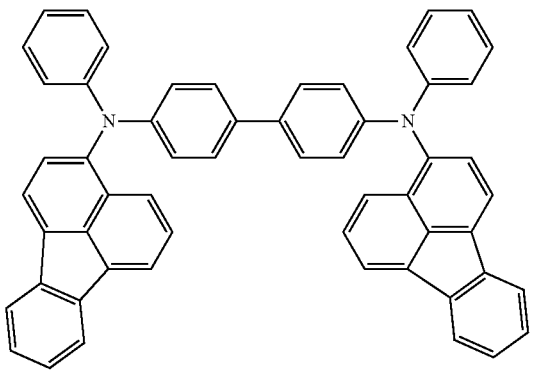 [SMILES: c1ccc(N(c2ccc(-c3ccc(N(c4ccccc4)c4ccc5c6c(cccc46)-c4ccccc4-5)cc3)cc2)c2ccc3c4c(cccc24)-c2ccccc2-3)cc1]
(2)-53
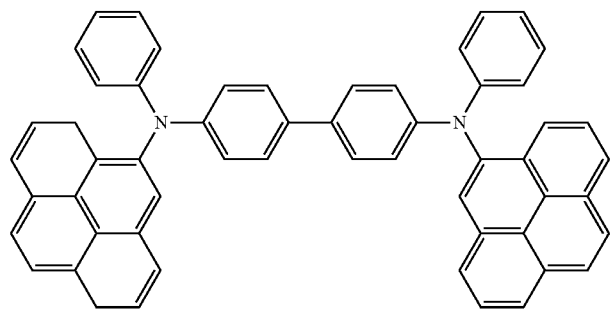
(2)-54
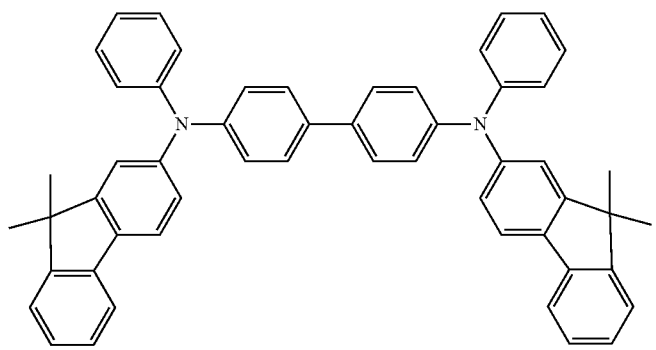
(2)-55
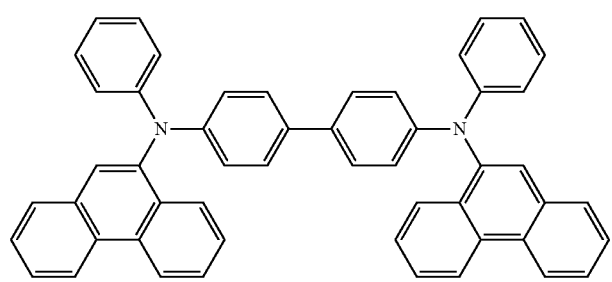 [SMILES: c1ccc(N(c2ccc(-c3ccc(N(c4ccccc4)c4cc5ccccc5c5ccccc45)cc3)cc2)c2cc3ccccc3c3ccccc23)cc1]
(2)-56

TABLE 3-continued
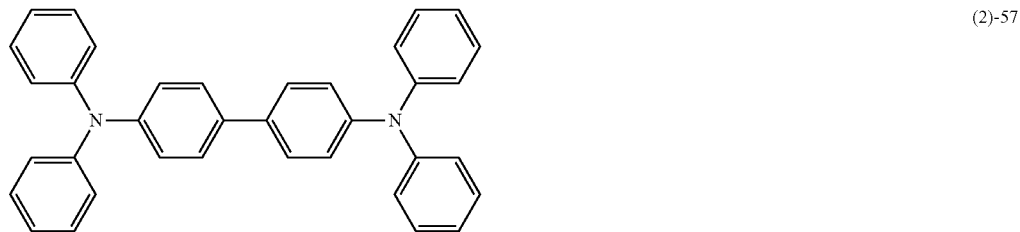
(2)-57
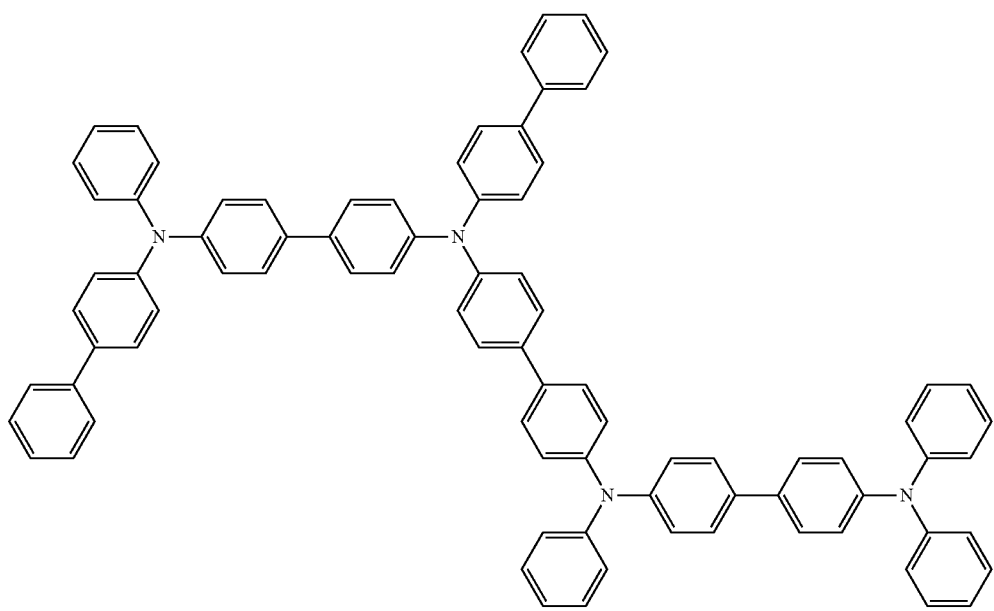 [SMILES: c1ccc(-c2ccc(N(c3ccccc3)c3ccc(-c4ccc(N(c5ccc(-c6ccccc6)cc5)c5ccc(-c6ccc(N(c7ccccc7)c7ccc(-c8ccc(N(c9ccccc9)c9ccccc9)cc8)cc7)cc6)cc5)cc4)cc3)cc2)cc1]
(2)-58

TABLE 3-continued
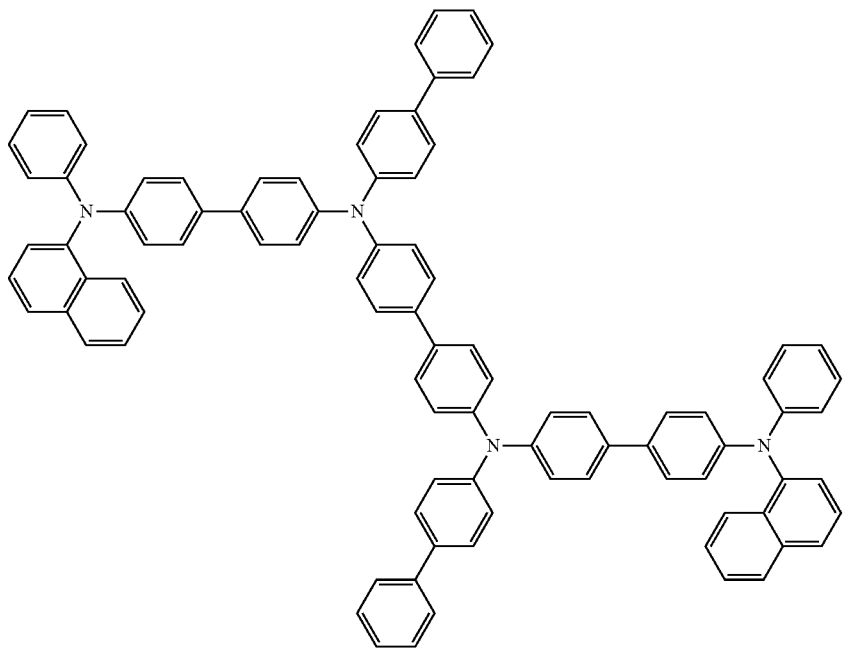 [SMILES: c1ccc(-c2ccc(N(c3ccc(-c4ccc(N(c5ccc(-c6ccccc6)cc5)c5ccc(-c6ccc(N(c7ccccc7)c7cccc8ccccc78)cc6)cc5)cc4)cc3)c3ccc(-c4ccc(N(c5ccccc5)c5cccc6ccccc56)cc4)cc3)cc2)cc1]
(2)-59
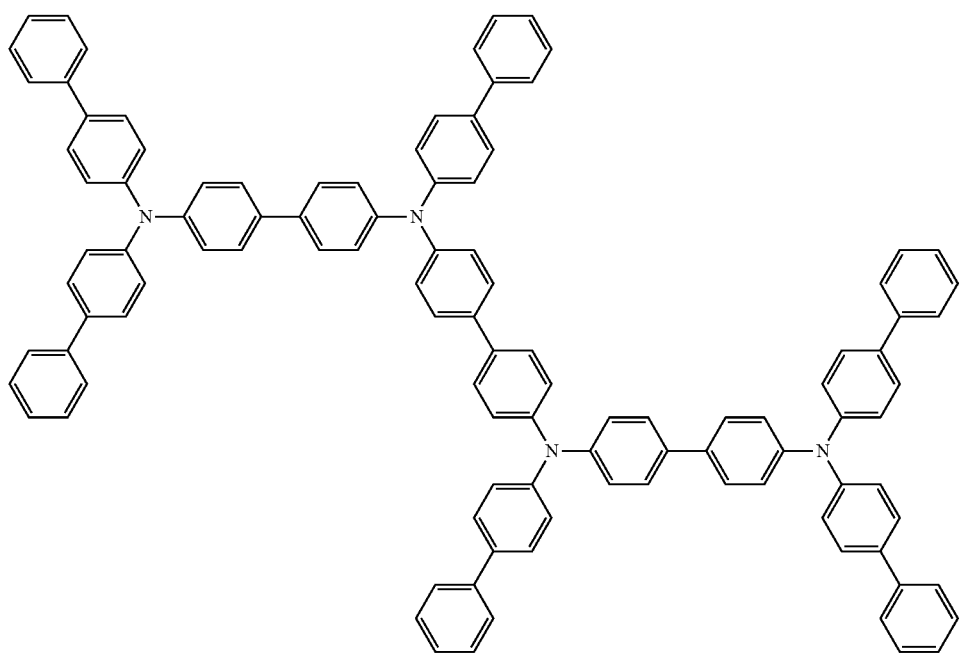 [SMILES: c1ccc(-c2ccc(N(c3ccc(-c4ccccc4)cc3)c3ccc(-c4ccc(N(c5ccc(-c6ccccc6)cc5)c5ccc(-c6ccc(N(c7ccc(-c8ccccc8)cc7)c7ccc(-c8ccc(N(c9ccc(-c%10ccccc%10)cc9)c9ccc(-c%10ccccc%10)cc9)cc8)cc7)cc6)cc5)cc4)cc3)cc2)cc1]
(2)-60
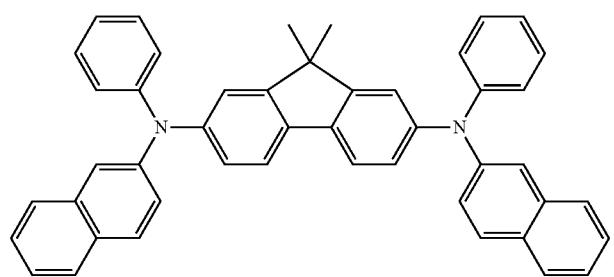 [SMILES: CC1(C)c2cc(N(c3ccccc3)c3ccc4ccccc4c3)ccc2-c2ccc(N(c3ccccc3)c3ccc4ccccc4c3)cc21]
(2)-61

TABLE 3-continued
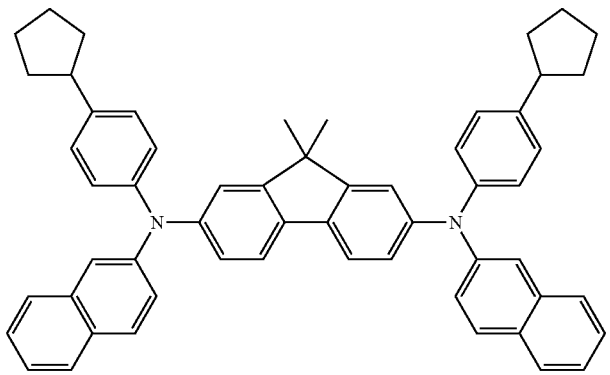 [SMILES: CC1(C)c2cc(N(c3ccc(C4CCCC4)cc3)c3ccc4ccccc4c3)ccc2-c2ccc(N(c3ccc(C4CCCC4)cc3)c3ccc4ccccc4c3)cc21]
(2)-62
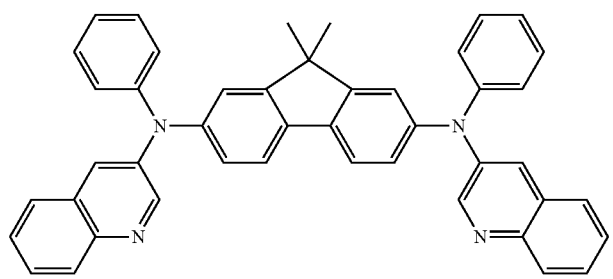 [SMILES: CC1(C)c2cc(N(c3ccccc3)c3cnc4ccccc4c3)ccc2-c2ccc(N(c3ccccc3)c3cnc4ccccc4c3)cc21]
(2)-63
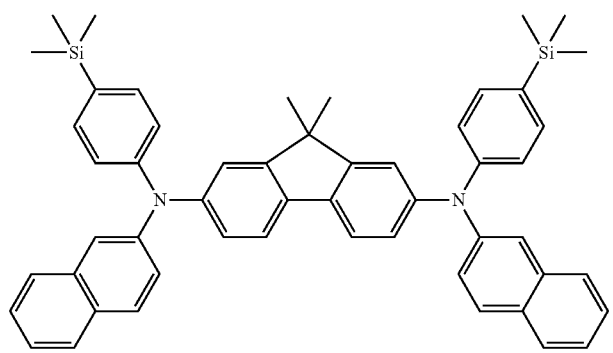 [SMILES: CC1(C)c2cc(N(c3ccc([Si](C)(C)C)cc3)c3ccc4ccccc4c3)ccc2-c2ccc(N(c3ccc([Si](C)(C)C)cc3)c3ccc4ccccc4c3)cc21]
(2)-64
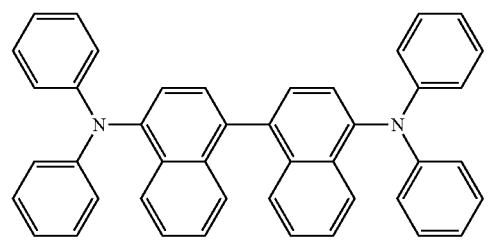 [SMILES: c1ccc(N(c2ccccc2)c2ccc(-c3ccc(N(c4ccccc4)c4ccccc4)c4ccccc34)c3ccccc23)cc1]
(2)-65
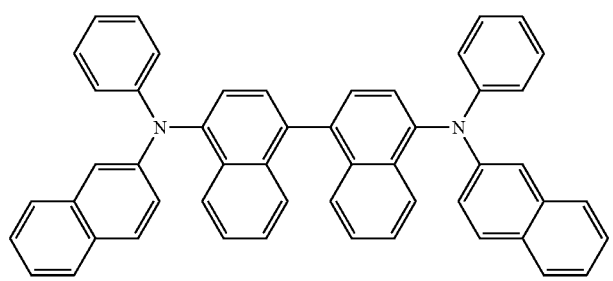 [SMILES: c1ccc(N(c2ccc3ccccc3c2)c2ccc(-c3ccc(N(c4ccccc4)c4ccc5ccccc5c4)c4ccccc34)c3ccccc23)cc1]
(2)-66

TABLE 3-continued
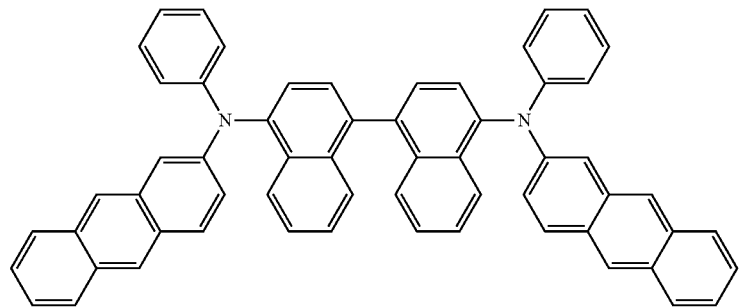 [SMILES: c1ccc(N(c2ccc3cc4ccccc4cc3c2)c2ccc(-c3ccc(N(c4ccccc4)c4ccc5cc6ccccc6cc5c4)c4ccccc34)c3ccccc23)cc1]
(2)-67
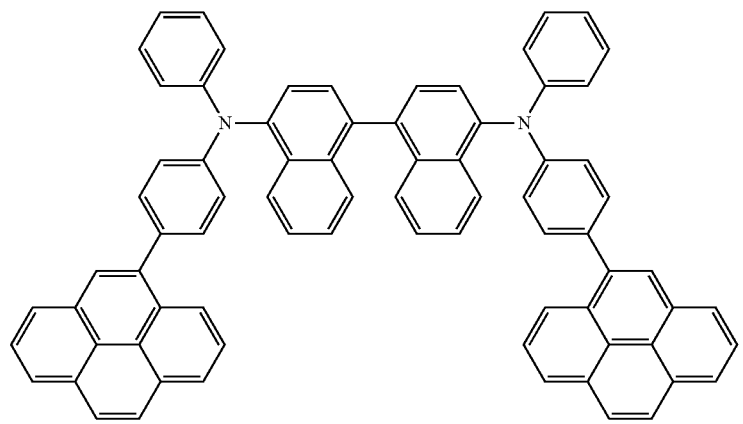 [SMILES: c1ccc(N(c2ccc(-c3cc4cccc5ccc6cccc3c6c54)cc2)c2ccc(-c3ccc(N(c4ccccc4)c4ccc(-c5cc6cccc7ccc8cccc5c8c76)cc4)c4ccccc34)c3ccccc23)cc1]
(2)-68
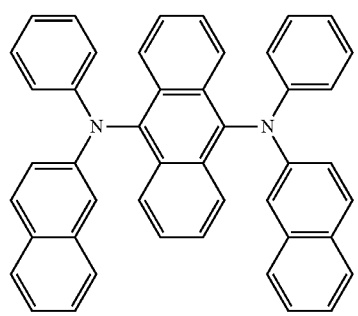 [SMILES: c1ccc(N(c2ccc3ccccc3c2)c2c3ccccc3c(N(c3ccccc3)c3ccc4ccccc4c3)c3ccccc23)cc1]
(2)-69
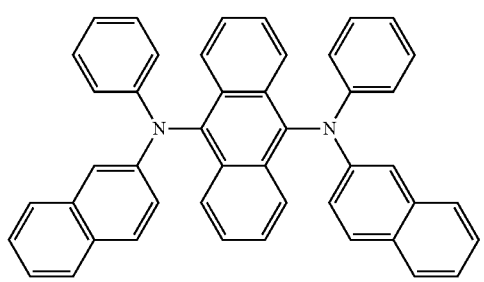 [SMILES: c1ccc(N(c2ccc3ccccc3c2)c2c3ccccc3c(N(c3ccccc3)c3ccc4ccccc4c3)c3ccccc23)cc1]
(2)-70
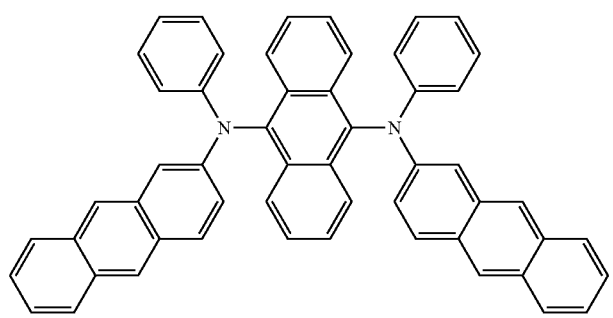 [SMILES: c1ccc(N(c2ccc3cc4ccccc4cc3c2)c2c3ccccc3c(N(c3ccccc3)c3ccc4cc5ccccc5cc4c3)c3ccccc23)cc1]
(2)-71

TABLE 3-continued
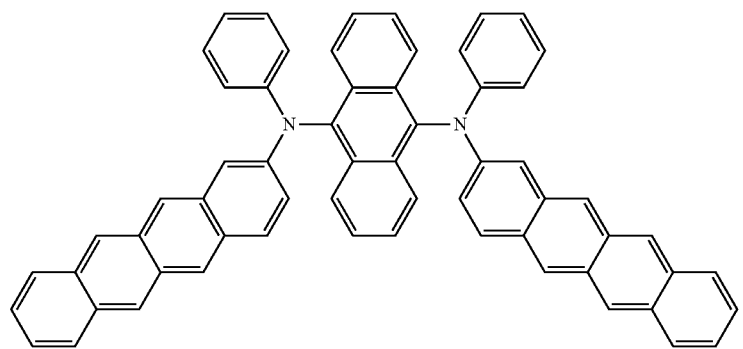 [SMILES: c1ccc(N(c2ccc3cc4cc5ccccc5cc4cc3c2)c2c3ccccc3c(N(c3ccccc3)c3ccc4cc5cc6ccccc6cc5cc4c3)c3ccccc23)cc1]
(2)-72
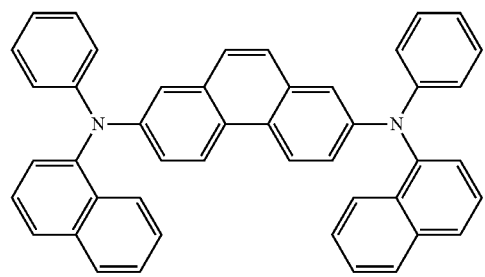 [SMILES: c1ccc(N(c2ccc3c(ccc4cc(N(c5ccccc5)c5cccc6ccccc56)ccc43)c2)c2cccc3ccccc23)cc1]
(2)-73
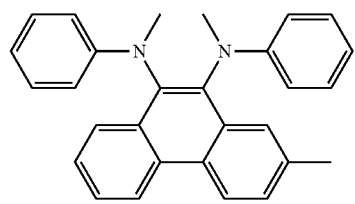 [SMILES: Cc1ccc2c(c1)c(N(C)c1ccccc1)c(N(C)c1ccccc1)c1ccccc12]
(2)-74
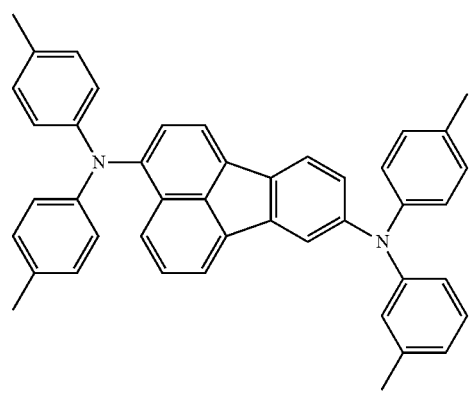 [SMILES: Cc1ccc(N(c2cccc(C)c2)c2ccc3c(c2)-c2cccc4c(N(c5ccc(C)cc5)c5ccc(C)cc5)ccc-3c24)cc1]
(2)-75

TABLE 3-continued
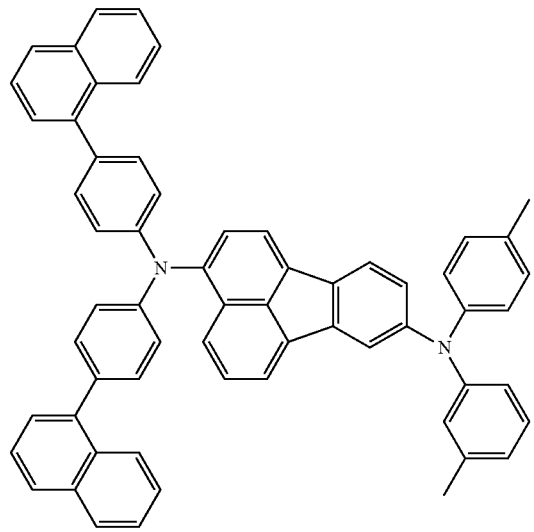 [SMILES: Cc1ccc(N(c2cccc(C)c2)c2ccc3c(c2)-c2cccc4c(N(c5ccc(-c6cccc7ccccc67)cc5)c5ccc(-c6cccc7ccccc67)cc5)ccc-3c24)cc1]
(2)-76
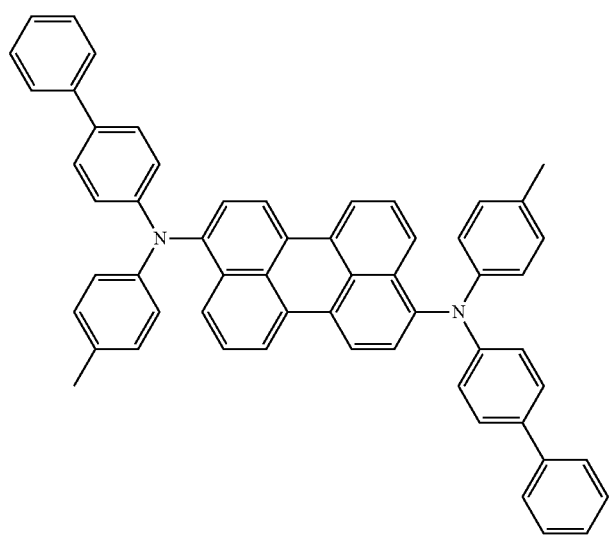 [SMILES: Cc1ccc(N(c2ccc(-c3ccccc3)cc2)c2ccc3c4cccc5c(N(c6ccc(C)cc6)c6ccc(-c7ccccc7)cc6)ccc(c6cccc2c63)c54)cc1]
(2)-77
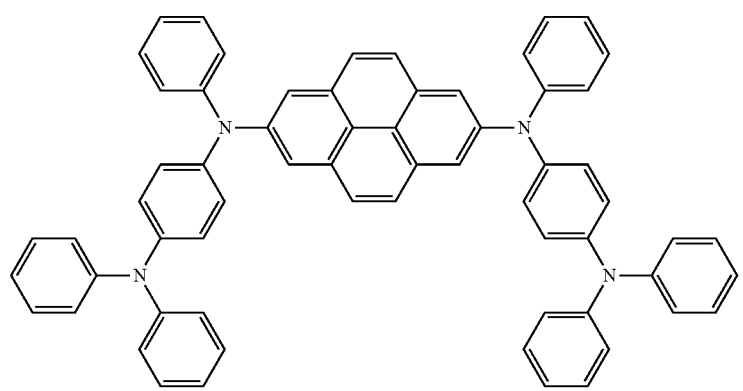 [SMILES: c1ccc(N(c2ccccc2)c2ccc(N(c3ccccc3)c3cc4ccc5cc(N(c6ccccc6)c6ccc(N(c7ccccc7)c7ccccc7)cc6)cc6ccc(c3)c4c56)cc2)cc1]
(2)-78

TABLE 3-continued
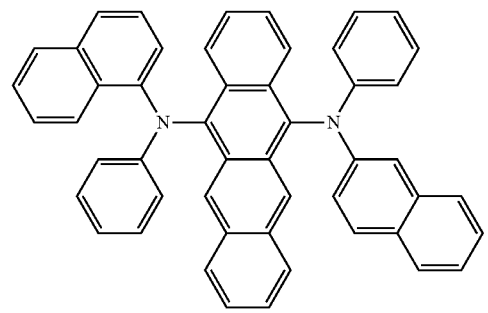 [SMILES: c1ccc(N(c2ccc3ccccc3c2)c2c3ccccc3c(N(c3ccccc3)c3cccc4ccccc34)c3cc4ccccc4cc23)cc1]
(2)-79
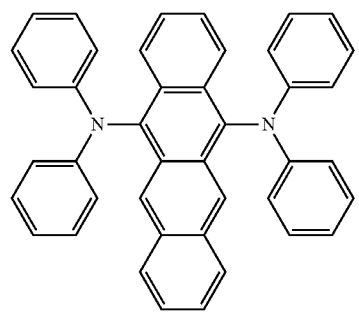 [SMILES: c1ccc(N(c2ccccc2)c2c3ccccc3c(N(c3ccccc3)c3ccccc3)c3cc4ccccc4cc23)cc1]
(2)-80
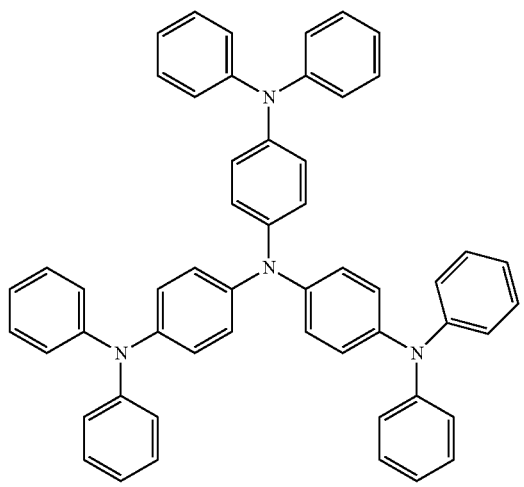 [SMILES: c1ccc(N(c2ccccc2)c2ccc(N(c3ccc(N(c4ccccc4)c4ccccc4)cc3)c3ccc(N(c4ccccc4)c4ccccc4)cc3)cc2)cc1]
(2)-81
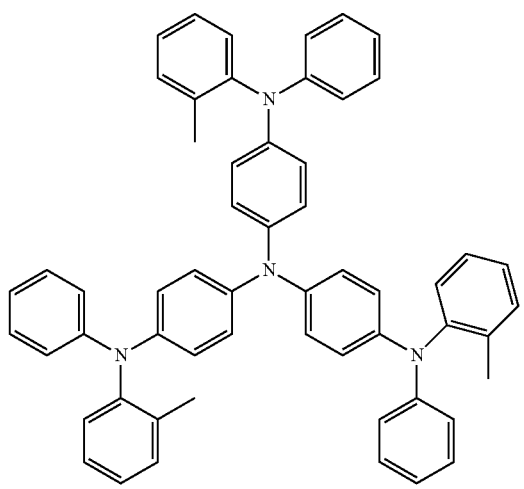 [SMILES: Cc1ccccc1N(c1ccccc1)c1ccc(N(c2ccc(N(c3ccccc3)c3ccccc3C)cc2)c2ccc(N(c3ccccc3)c3ccccc3C)cc2)cc1]
(2)-82

TABLE 3-continued
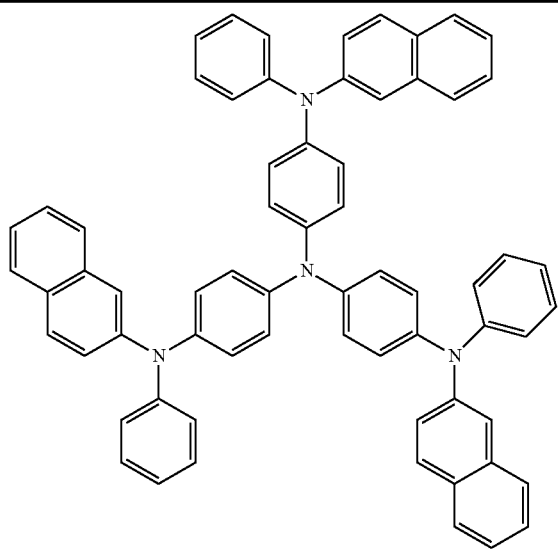
(2)-83
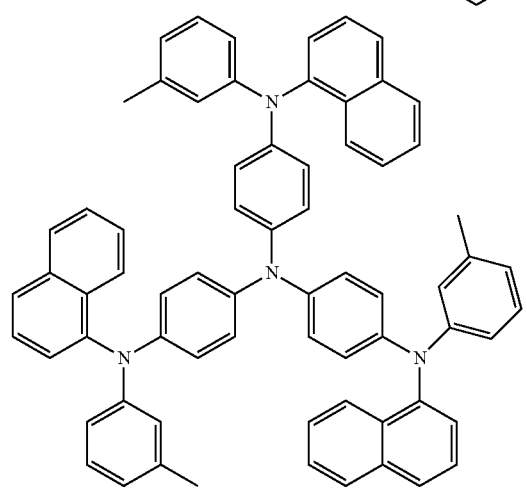
(2)-84
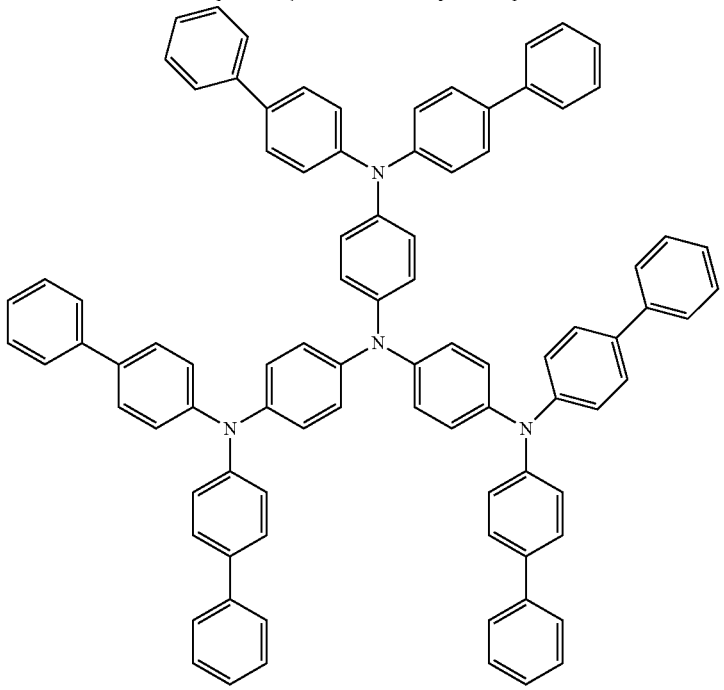 [SMILES: c1ccc(-c2ccc(N(c3ccc(-c4ccccc4)cc3)c3ccc(N(c4ccc(N(c5ccc(-c6ccccc6)cc5)c5ccc(-c6ccccc6)cc5)cc4)c4ccc(N(c5ccc(-c6ccccc6)cc5)c5ccc(-c6ccccc6)cc5)cc4)cc3)cc2)cc1]
(2)-85

TABLE 3-continued
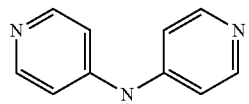
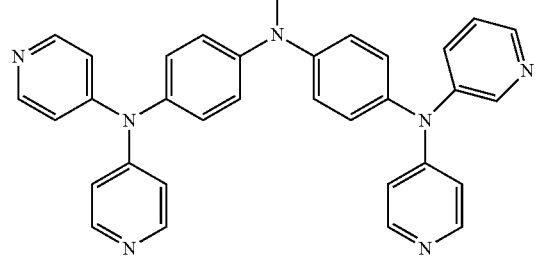
(2)-86
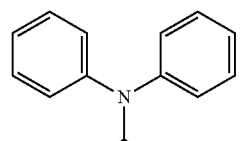
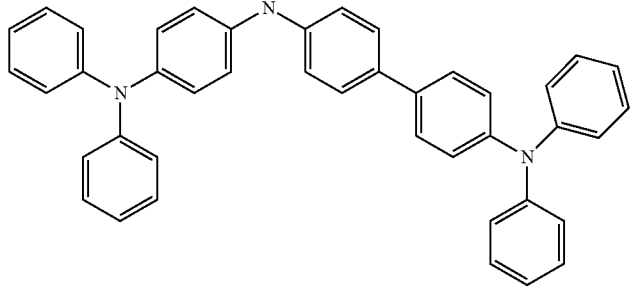
(2)-87
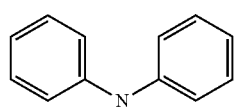
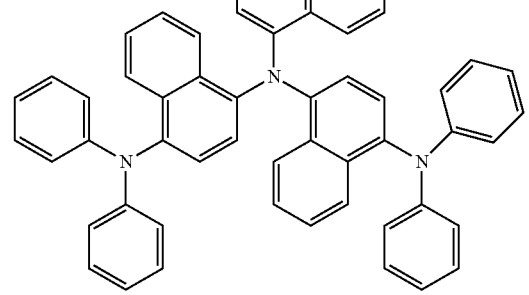
(2)-88

TABLE 3-continued
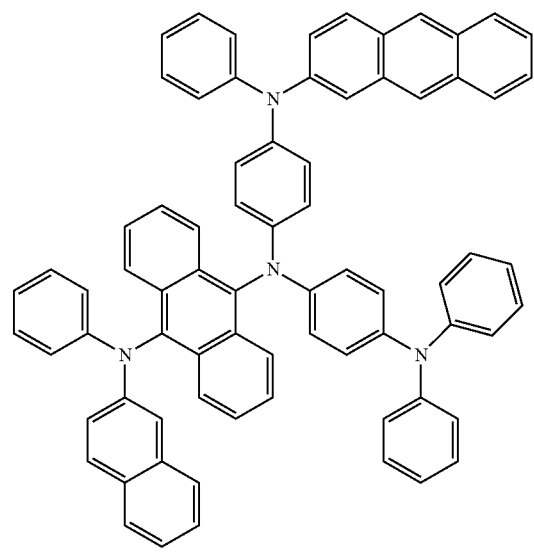 [SMILES: c1ccc(N(c2ccccc2)c2ccc(N(c3ccc(N(c4ccccc4)c4ccc5cc6ccccc6cc5c4)cc3)c3c4ccccc4c(N(c4ccccc4)c4ccc5ccccc5c4)c4ccccc34)cc2)cc1]
(2)-89
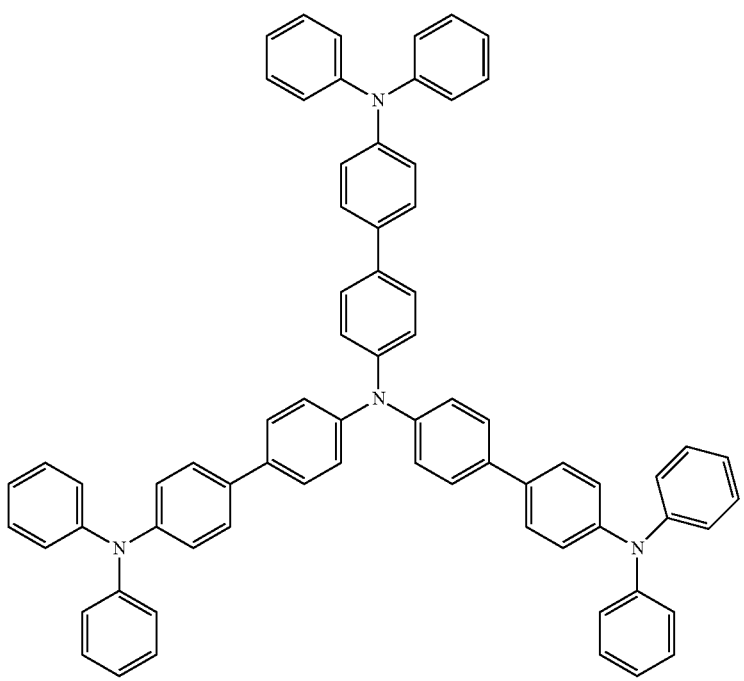 [SMILES: c1ccc(N(c2ccccc2)c2ccc(-c3ccc(N(c4ccc(-c5ccc(N(c6ccccc6)c6ccccc6)cc5)cc4)c4ccc(-c5ccc(N(c6ccccc6)c6ccccc6)cc5)cc4)cc3)cc2)cc1]
(2)-90

TABLE 3-continued
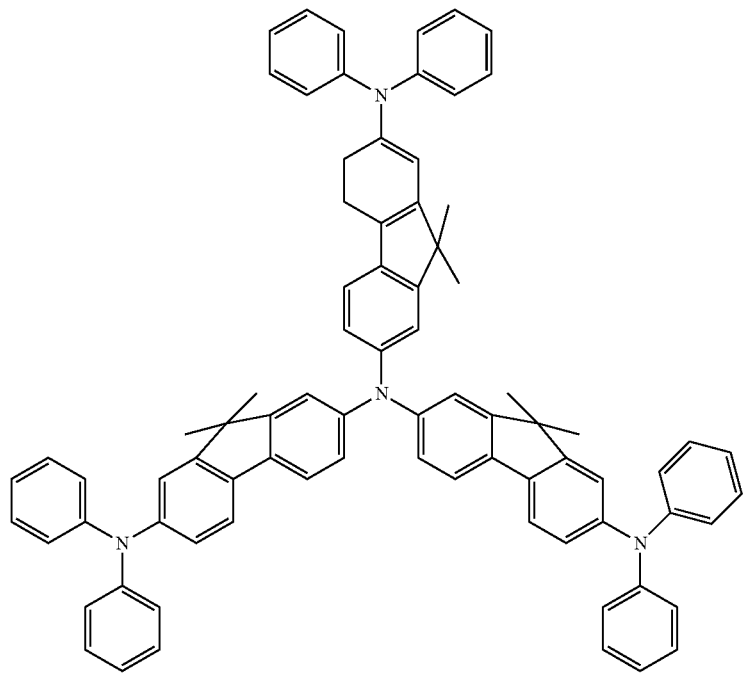 [SMILES: CC1(C)C2=C(CCC(N(c3ccccc3)c3ccccc3)=C2)c2ccc(N(c3ccc4c(c3)C(C)(C)c3cc(N(c5ccccc5)c5ccccc5)ccc3-4)c3ccc4c(c3)C(C)(C)c3cc(N(c5ccccc5)c5ccccc5)ccc3-4)cc21]
(2)-91
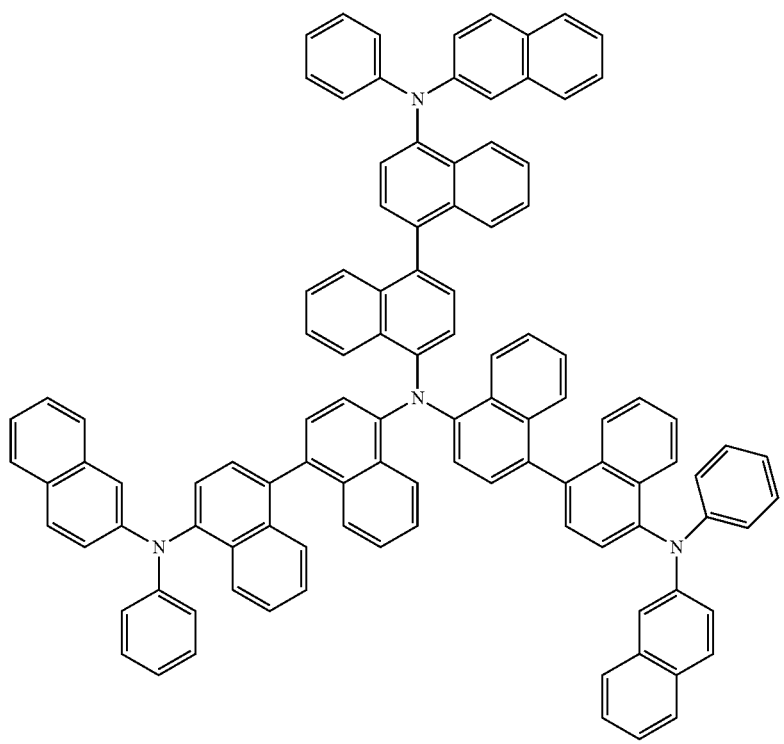 [SMILES: c1ccc(N(c2ccc3ccccc3c2)c2ccc(-c3ccc(N(c4ccc(-c5ccc(N(c6ccccc6)c6ccc7ccccc7c6)c6ccccc56)c5ccccc45)c4ccc(-c5ccc(N(c6ccccc6)c6ccc7ccccc7c6)c6ccccc56)c5ccccc45)c4ccccc34)c3ccccc23)cc1]
(2)-92

TABLE 3-continued
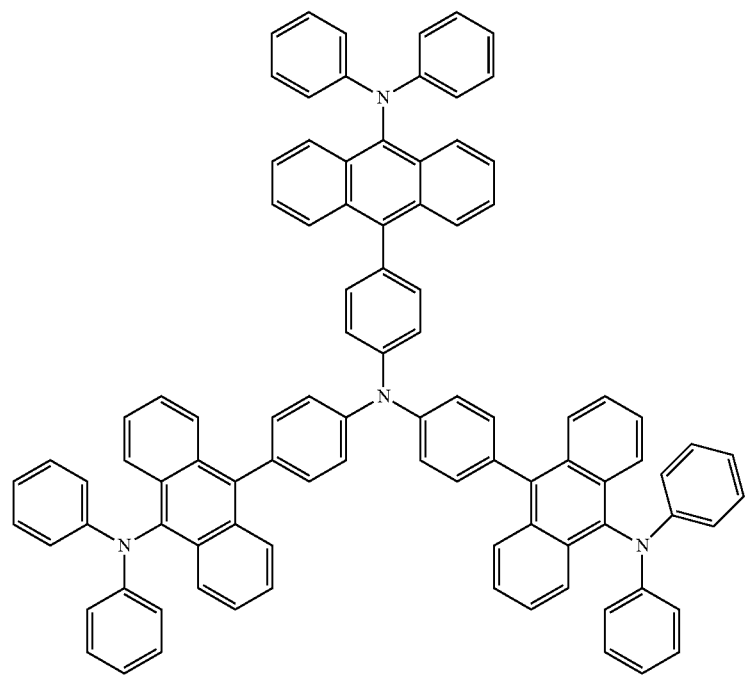 [SMILES: c1ccc(N(c2ccccc2)c2c3ccccc3c(-c3ccc(N(c4ccc(-c5c6ccccc6c(N(c6ccccc6)c6ccccc6)c6ccccc56)cc4)c4ccc(-c5c6ccccc6c(N(c6ccccc6)c6ccccc6)c6ccccc56)cc4)cc3)c3ccccc23)cc1]
(2)-93
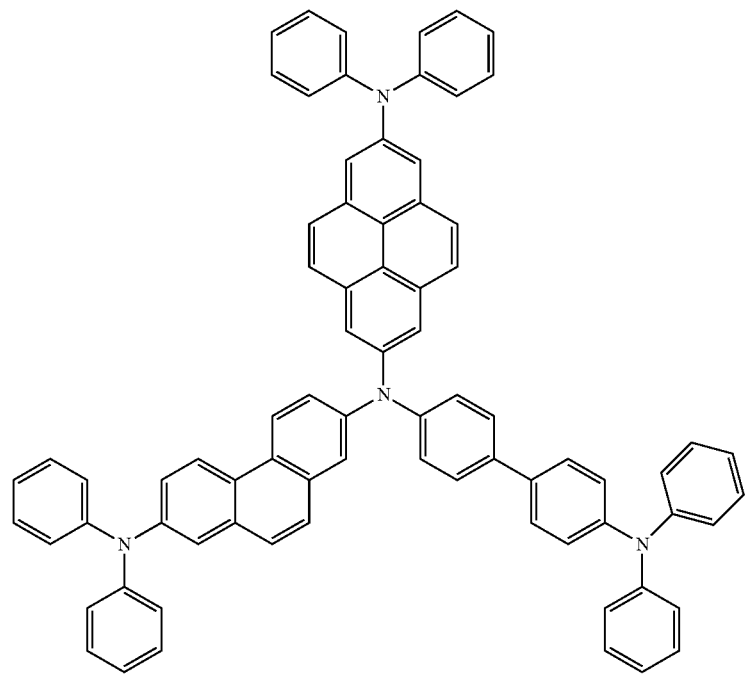 [SMILES: c1ccc(N(c2ccccc2)c2ccc(-c3ccc(N(c4ccc5c(ccc6cc(N(c7ccccc7)c7ccccc7)ccc65)c4)c4cc5ccc6cc(N(c7ccccc7)c7ccccc7)cc7ccc(c4)c5c67)cc3)cc2)cc1]
(2)-94

TABLE 3-continued (2)-95

Procedures for manufacturing the display devices of Examples 1' to 24' are to be described below.

Examples 1' to 10'

Substrates used for the evaluation of top emission organic electroluminescence devices were manufactured each by forming silver alloy as an anode 113 above a substrate 112 made of a glass plate sized 30 mm×30 mm, forming ITO (film thickness: about 10 nm) as a protective layer and hole injecting electrode and, further, masking regions other than the 2 mm×2 mm light emission region with an insulative film (not illustrated) by $SiO_2$ vapor deposition.

Then, a hole injecting material comprising a triphenylene derivative: compound (3)-10 was formed at a film thickness of 11 nm by a vacuum vapor deposition method (vapor deposition rate: 0.2 to 0.4 nm/sec) as a hole injecting layer 114a constituting the light emission unit 114-1 at the first layer (vapor deposition rate: 0.2 to 0.4 nm/sec).

Then, α-NPD (Bis[N-(1-naphthyl)-N-phenyl]bendizine) was formed at a film thickness of 11 nm by a vacuum vapor deposition method (vapor deposition rate: 0.2 to 0.4 nm/sec) as a hole transporting layer 114b.

Further, as a light emission layer 114c, ADN was used as a host material and BD-052x (trade name of products manufactured by Idemitsu Kosan Co.) was used as a dopant and the materials were formed to a film at a thickness of 28 nm in total such that the film thickness ratio was 5% by a vacuum vapor deposition method.

Finally, as the electron transporting layer 114d Alq3[Tris (8-hydroxyquinolinato)aluminum (III)] was formed to a film at a thickness of 10 nm by a vacuum vapor deposition method.

After forming the light emission unit 114-1 at the first layer as described above, the materials shown in the following Table 4 were vapor deposited successively as an oxide containing layer 115a, a charge transporting organic material layer 115b, and a triphenylene layer 115c thereby forming the connection layer 115.

TABLE 4

| | Oxide containing layer 115a | Charge transporting organic material layer 115b | Triphenylene layer 115c | Light emission efficiency [cd/A] |
|---|---|---|---|---|
| (Electron transportability) | | | | |
| Example 1' | $Li_2CO_3$ | Compound (1)-1 | Compound (3)-10 | 6.2 |
| Example 2' | | Compound (1)-2 | Compound (3)-10 | 6.1 |
| Example 3' | | Compound (1)-3 | Compound (3)-10 | 6.2 |
| Example 4' | | Compound (1)-20 | Compound (3)-10 | 6.0 |
| Example 5' | | Compound (1)-1 | Compound (3)-34 | 5.9 |
| Example 6' | | Compound (1)-1 | Compound (3)-66 | 6.0 |
| Example 7' | $Li_2SiO_3$ | Compound (1)-1 | Compound (3)-10 | 6.1 |
| Example 8' | | Compound (1)-2 | Compound (3)-10 | 6.0 |
| Example 9' | | Compound (1)-3 | Compound (3)-10 | 6.1 |
| Example 10' | | Compound (1)-4 | Compound (3)-10 | 5.8 |
| Example 11' | $Li_2CO_3$ + Compound (1)-1 | Compound (1)-1 | Compound (3)-10 | 6.0 |
| Example 12' | $Li_2CO_3$ | Compound (1)-1/ Compound (1)-1 + Compound (3)-10 | Compound (3)-10 | 5.9 |
| (Hole transportability) | | | | |
| Example 13' | $Li_2CO_3$ | Compound (2)-34 | Compound (3)-10 | 6.0 |
| Example 14' | | Compound (2)-35 | Compound (3)-10 | 6.0 |

TABLE 4-continued

| | Oxide containing layer 115a | Charge transporting organic material layer 115b | Triphenylene layer 115c | Light emission efficiency [cd/A] |
|---|---|---|---|---|
| Example 15' | | Compound (2)-42 | Compound (3)-10 | 5.9 |
| Example 16' | | Compound (2)-46 | Compound (3)-10 | 6.0 |
| Example 17' | | Compound (2)-34 | Compound (3)-34 | 5.9 |
| Example 18' | | Compound (2)-34 | Compound (3)-66 | 6.0 |
| Example 19' | $Li_2SiO_3$ | Compound (2)-34 | Compound (3)-10 | 6.1 |
| Example 20' | | Compound (2)-35 | Compound (3)-10 | 6.0 |
| Example 21' | $Li_2CO_3$ | Compound (2)-57 | Compound (3)-10 | 6.0 |
| Example 22' | | Compound (2)-83 | Compound (3)-10 | 5.7 |
| Example 23' | $Li_2CO_3$ + Compound (2)-34 | Compound (2)-34 | Compound (3)-10 | 5.8 |
| Example 24' | $Li_2CO_3$ | Compound (2)-34/ Compound (2)-34 + Compound (3)-10 | Compound (3)-10 | 5.7 |
| Comp. Example 1' | $Li_2CO_3$ | — | Compound (3)-10 | 6.3 |
| Comp. Example 2' | LiF/Alq3 + Mg/Compound (3)-10 | | | 6.2 |
| Comp. Example 3' | — | — | — | 3.0 |

For example, in Example 1', $Li_2CO_3$ was formed to a film at 0.3 nm thickness as the oxide containing layer 115a, the compound (1)-1 was formed to a film at 5 nm thickness as the charge transporting organic material layer 115b having an electron transporting property and, finally, the compound (3)-10 was formed to a film at 60 nm thickness as the triphenylene layer 115c. Further, also in Examples 2' to 10', materials shown in Table 4 were formed at the same film thickness as in Example 1' by vapor deposition.

After the procedures as described above, a light emission unit 114-2 was formed in the same manner as the light emission unit 114-1 at the first layer.

Then, LiF was formed to a film at about 0.3 nm thickness as a first layer 116a of a cathode 116 by a vacuum vapor deposition method (vapor deposition rate: 0.01 nm/sec or less) and then MgAg was formed to a film of 10 nm thickness as a second layer 116b to form the cathode 116 of a two-layered structure. Thus, a top emission display device 110 was manufactured.

Example 11'

The manufacturing procedures were conducted in the same manner as those in Example 1' except for co-vapor depositing $Li_2CO_3$ and the compound (1)-1 as the oxide-containing layer 115a to form the oxide containing layer 115a of the mixed layer in Example 1'. The oxide layer 115a had a compositional ratio of $Li_2CO_3$:compound (1)-1=4:1 (ratio of film thickness) and was formed to a film at 3 nm thickness. Further, the charge transporting organic material layer 115b comprising the compound (1)-1 was formed to a film at a thickness of 2 nm.

Example 12'

The manufacturing procedures were conducted in the same manner as those in Example 1' except for forming the compound (1)-1 to a film at 3 nm thickness as the charge transporting organic material layer 115b and then, forming a mixed layer of the compound (1)-1 and the compound (3)-10 to a film at a thickness of 2 nm to form a charge transporting organic material layer 115b of a two-layered structure. The compositional ratio of the compound (1)-1 and the compound (3)-10 in the mixed layer was 1:1 (ratio of film thickness).

Examples 13' to 22'

In the formation of the connection layer 115 in the manufacturing procedures of Example 1', the materials shown in the Table 4 were vapor deposited successively as the oxide containing layer 115a, the charge transporting organic material layer 115b and the triphenylene layer 115c thereby forming the connection layer 115. Other procedures than those described above were conducted in the same manner as in Example 1'.

For example, in Example 13', $Li_2CO_3$ was formed to a film at 0.3 nm thickness as the oxide containing layer 115a, then, the compound (2)-34 was formed to a film at a thickness of 2.5 nm as the charge transporting organic material layer 115b having a hole transporting property and, finally, the compound (3)-10 was formed to a film at 62.5 nm thickness as the triphenylene layer 115c. Further, also in Examples 14' to 22', the materials shown in Table 4 were formed to films of the same thickness as in Example 13' by vapor deposition.

Example 23'

The manufacturing procedures were conducted in the same manner as in Example 13' except for co-vapor depositing $Li_2CO_3$ and the compound (2)-34 as the oxide containing layer 115a, to form the oxide containing layer 115a of the mixed layer in Example 13'. The oxide containing layer 115a of the mixed layer had a compositional ratio of $Li_2CO_3$: compound (2)-34=4:1 (ratio of film thickness) and was formed to a film at 3 nm thickness. Further, the charge transporting organic material layer 115b comprising the compound (2)-34 was formed to a film at a thickness of 2 nm.

Example 24'

The manufacturing procedures were conducted in the same manner as those in Example 13' except for forming the compound (2)-34 to a film at 3 nm thickness as the charge transporting organic material 115b and then forming a mixed layer of the compound (2)-34 and the compound (3)-10 to a film at 2 nm thickness to form a charge transporting organic material layer 115b of a two-layered structure in Example 13'. The compositional ratio of the compound (2)-34 and the compound (3)-10 in the mixed layer was 1:1 (ratio of film thickness).

Comparative Example 1'

The manufacturing procedures were conducted in the same manner as in Example 1' except for forming the connection layer 115 of a laminate structure of the oxide containing layer 115a and the triphenylene layer 115c without forming the charge transporting organic material layer 115b in the formation of the connection layer 115 in Example 1'.

Comparative Example 2'

In the manufacturing procedures of Example 1', a connection layer having a structure in which an LiF layer, the mixed layer of Alq3 and Mg described above, and the layer comprising the compound (3)-10 were laminated in this order was formed in the formation of the connection layer 115.

Comparative Example 3'

In Comparative Example 3' the cathode 116 was formed directly on the light emission unit 114-1 at the first layer to manufacture a not tandem one-unit display device in the manufacturing procedures of Example 1'.

Result of Evaluation

Table 4 shows the light emission efficiency (Quantum Yield: Q/Y) of the display devices manufactured in Example 1' to 12', 13' to 24', and Comparative Examples 1' to 3'. It was confirmed from the result that the light emission efficiency in the display devices of Examples 1' to 24' was about twice the efficiency of the display device of the one-unit structure of Comparative Example 3' and the effect due to the tandem structure formed by laminating the light emission units in two layers was obtained. In the tandem device, it was expected that the light emission efficiency was doubled by stacking the light emission units in two stages in an ideal device, and it was confirmed almost ideal elements could be obtained in Examples 1 to 24. The emission efficiency was increased to about twice also in Comparative Examples 1 and 2 and the effect due to the tandem structure was obtained.

(a)-(h) in the following Table 5 show the relative luminance and the operating voltage after operation for initial 100 hours (100 h) and for 800 hours (800 h) normally at a room temperature (30*C) and at a high temperature (60° C.) of Examples 1', 13' and Comparative Examples 1' to 3' manufactured as described above. As the operating condition, operation at a room temperature was conducted as the constant current operation at 70 mA/cm² and operation at a high temperature was conducted as constant current operation at 20 mA/me.

TABLE 5

| | | Example 1' | Example 13' | Comp. Example 1' | Comp. Example 2' | Comp. Example 3' |
|---|---|---|---|---|---|---|
| (a) | Relative luminance - 100 h (30° C.) | 0.93 | 0.87 | 0.85 | 0.91 | 0.96 |
| (b) | Relative luminance - 800 h (30° C.) | 0.69 | 0.67 | 0.64 | 0.60 | 0.76 |
| (c) | Operating voltage (initial ΔV)-100 h (30° C.) (V) | 0.60 | 1.01 | 1.00 | 0.10 | −0.20 |
| (d) | Operating voltage (ΔV) - 800 h (30° C.) (V) | 1.30 | 1.45 | 1.60 | 0.90 | 0.00 |
| (e) | Relative luminance - 100 h (60° C.) | 0.94 | 0.93 | 0.86 | 0.91 | 0.97 |
| (f) | Relative luminance - 800 h (60° C.) | 0.85 | 0.85 | 0.77 | 0.78 | 0.95 |
| (g) | Operating voltage (initial ΔV)- 100 h (60° C.) (V) | −0.30 | 1.15 | 1.00 | 0.40 | 0.10 |
| (h) | Operating voltage (ΔV) - 800 h (60° C.) (V) | −0.20 | 1.32 | 1.30 | 0.70 | 0.10 |

(a) Relative Luminance (30° C., 100 h)

In Examples 1' and 13' having the connection layer 115 of the laminate structure as another embodiment of the invention, it was confirmed that lowering of the luminance of the initial stage (100 h) was distinctly improved compared with Comparative Example 1 not having the connection layer of such a laminate structure and that the performance approached to that of Comparative Example 3' of at one unit structure. Particularly, in Example 1' of using the electron transporting material as the charge transporting organic material layer 115b in the connection layer 115, lowering of the initial stage luminance was improved even compared with Comparative Example 2 and the effect of using the electron transporting material as the charge transporting organic material layer 115b was confirmed.

(b) Relative Luminance (30° C., 800 h)

In view of the result of Example 1' and Example 13' having the connection layer 115 of the laminate structure as the embodiment of the invention, deterioration was distinctly suppressed compared with Comparative Examples 1' and 2' not having such a connection layer of the laminate structure and the effect of improving the long time reliability according to the embodiment of the invention was confirmed. Further, since Comparative Example 2' showing relatively less degradation during the initial 100 h stage deteriorated most after 800 h, this suggested that the stationary degradation rate was high in the structure of Comparative Example 2'. On the other hand, Example 1' and Example 13' showed low stationary degradation rate and were excellent in the long time reliability.

(c), (d) (Operating Voltage (30° C., 100 h, 800 h)

The change with time of the operating voltage in Example 1' and Example 13' having the connection layer 115 as a laminate structure as another embodiment of the invention was large compared with Comparative Example 3' of the one-unit structure. However, it was confirmed that increase in the operating voltage was suppressed distinctly compared with Comparative Example 1'.

(e), (f) Relative Luminance (60° C., 100 h, 800 h)

It was confirmed that degradation of the luminance at the high temperature in Example 1' and Example 13' according to the embodiment of the invention was suppressed distinctly compared with Comparative Example 1' and Comparative Example 2'.

(g) (h) Operating Voltage (60° C., 100 h, 800 h)

Increase in the voltage at high temperature in Example 1' having the connection layer 115 as the laminate structure according to the embodiment of the invention showed apparently smaller value compared with Comparative Example 1', Comparative Example 2', and Comparative Example 3'. This suggested that the structure is excellent in the operating stability at high temperature. On the contrary, while increase in the voltage at the room temperature and at the high temperature in Example 13' showed larger values compared with Comparative Example 1', Comparative Example 2', and Comparative Example 3', suppression for the degradation of the luminance which is considered most important could be obtained.

Also in Examples 2' to 12', change of the relative luminance or increase in the operating voltage at the room temperature and at the high temperature showed similar trend as in Example 1' both for 100 h and 800 h, and the effect of providing the connection layer having the structure according to the embodiment of the invention was apparent.

Further, also in Examples 14' to 24', change of the relative luminance or increase in the operating voltage at room temperature and at the high temperature showed similar trend as in Example 13' both for 100 h and 800 h.

Figure 5:
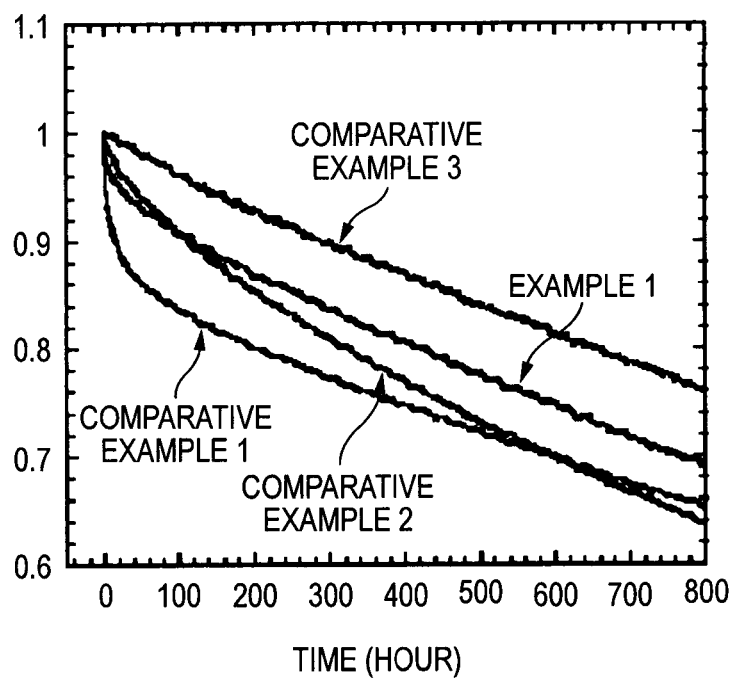
FIG. 5 is a graph showing change with time of a relative luminance (life curve) in display devices of Example 1' and Comparative Examples 1' to 3'.
Figure 6:
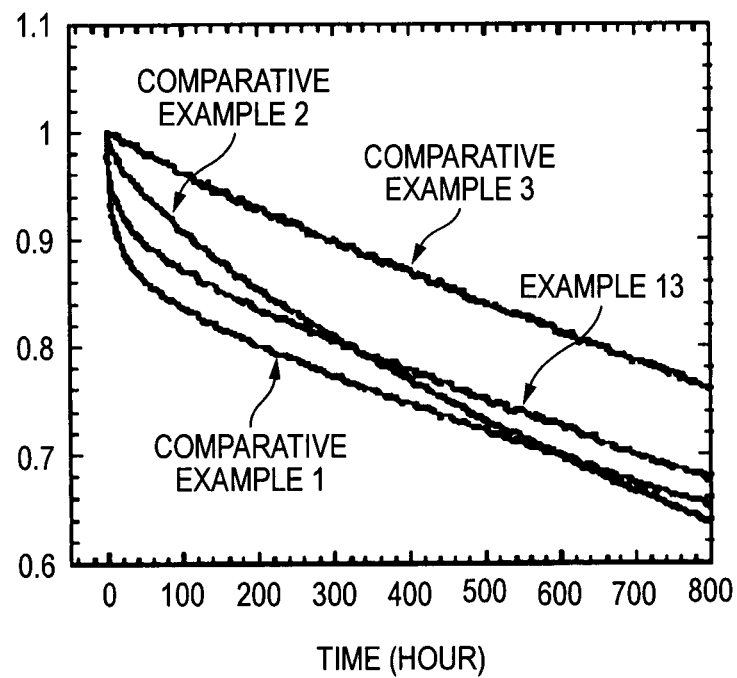
FIG. 6 is a graph showing change with time of a relative luminance (life curve) in display devices of Example 13' and Comparative Examples 1' to 3'.

FIG. 5 shows the life curve for Example 1' together with life curves for Comparative Examples 1' to 3'. Further, FIG. 6 shows the life curve for Example 13' together with life curves for Comparative Examples 1' to 3'. Also in view of the results, it can be seen that degradation in the initial stage of the relative luminance was large in Comparative Example 1', which was improved in Example 1' and Example 13'.

Figure 7:
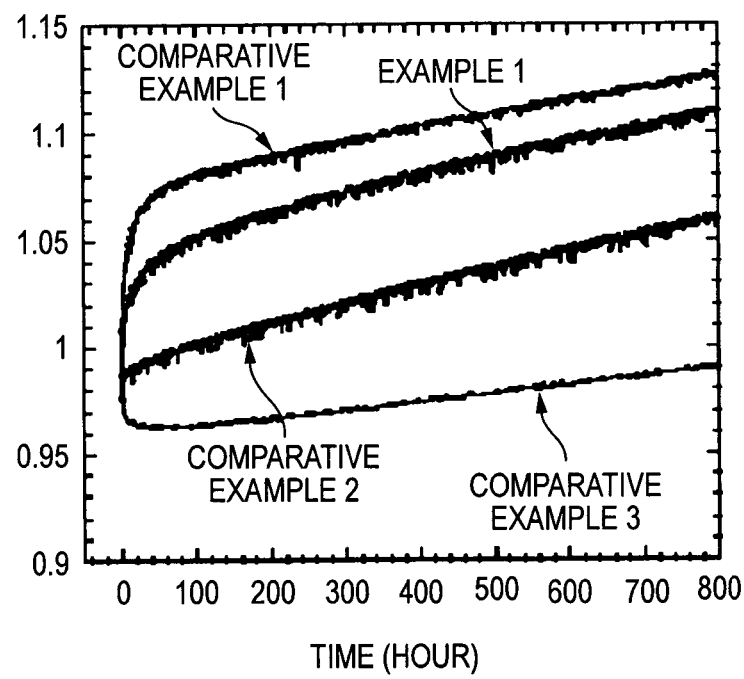
FIG. 7 is a graph showing change with time of a relative voltage in display devices of Example 1' and Comparative Examples 1' to 3'.
Figure 8:
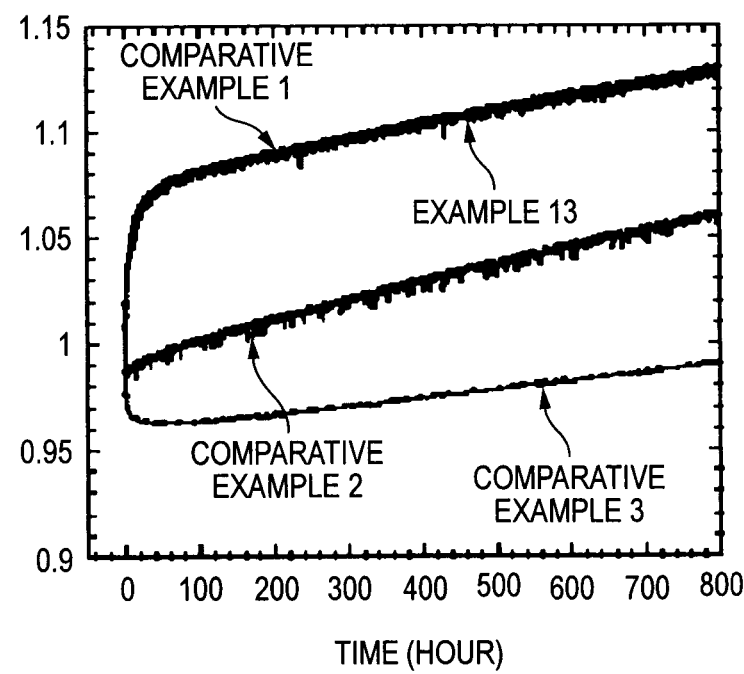
FIG. 8 is a graph showing change with time of a relative voltage in display devices of Example 13' and Comparative Examples 1' to 3'.

FIG. 7 shows the relative change of voltage in Example 1' together with relative change of voltage in Comparative Examples 1' to 3'. FIG. 8 shows the relative change of voltage in Example 13' together with the relative change of voltage in Comparative Examples 1' to 3'. From the results, it can be seen that the increase in voltage was improved particularly in Example 1' using the electron transporting material as the charge transporting organic material layer in the connection layer 115 compared with Comparative Example 1'.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:

a plurality of light emission units, each unit including an organic layer and an electron injecting layer, the plurality of light emission units laminated between an anode and a cathode; and a connection layer provided between each of the light emission units, wherein, the organic layer in each light emission unit includes a hole injection layer, a hole transporting layer, a light emission layer, an electron transporting layer in direct succession in the recited order, the electron injecting layer in each light emission unit and the connecting layer each includes the following layers successively laminated including (1) a buffer layer of a thickness of 1 nm or less in contact with at least the organic layer of one light emission unit, the buffer layer (a) employing an oxide which contains at least one of an alkali metal and an alkaline-earth metal, and (b) the buffer layer having a hole blocking property resulting from disposing the buffer layer in contact with the organic layer, (2) a mixed layer employing a charge transporting organic material having an electron transporting property and a metal material having an electron injecting property, the metal material reacts while reducing the charge transporting organic material to become transparent to ensure the electron injecting property, and (3) a protective layer, the protective layer of the connection layer has a triphenylene layer containing at least one of triphenylene derivatives and azatriphenylene derivatives represented by the following general formula (1) as a boundary layer of the cathode side:

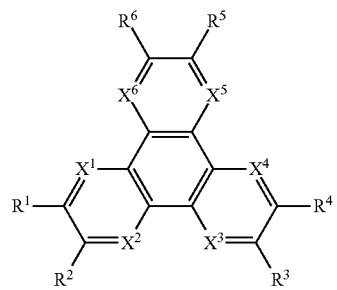

Formula (1)

in which $R^1$ to $R^6$ each represents independently a hydrogen, halogen, hydroxyl group, amino group, arylamino group, substituted or not-substituted carbonyl group of 20 or less carbon atoms, substituted or not-substituted carbonyl ester group of 20 or less carbon atoms, substituted or not-substituted alkyl group of 20 or less carbon atoms, substituted or not-substituted alkenyl group of 20 or less carbon atoms, substituted or not-substituted alkoxyl group of 20 or less carbon atoms, substituted or not-substituted aryl group of 30 or less carbon atoms, substituted or not-substituted heterocyclic group of 30 or less carbon atoms, or a substituent selected from nitrile group, nitro group, cyano group, or silyl group, adjacent $R^m$, where m=1 to 6, may join to each other by way of a cyclic structure and, further, $x^1$ to $x^6$ in the formula (1) each represents independently a carbon or nitrogen atom, wherein an organic material represented by the formula (1) is a material of the following formula (2):

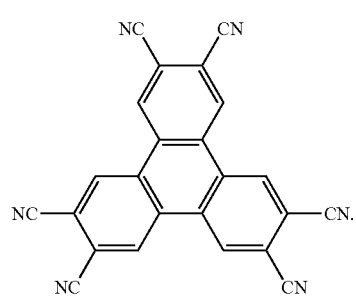 [SMILES: N#Cc1cc2c3cc(C#N)c(C#N)cc3c3cc(C#N)c(C#N)cc3c2cc1C#N]

Formula (2)

2. The display device according to claim 1, wherein a concentration of the metal material is between 0.1%-10% by weight of the mixed layer.

3. The display device according to claim 1, wherein metal material is oxidized to become light permeable upon forming the upper electrode.

4. The display device according to claim 1, wherein the buffer layer has a hole block property confining holes to the organic layer, and each of the layers comprising the electron injection layer are of a thickness such that transmittance at a wavelength region of from 440 to 700 nm is 85% or more.

5. The display device according to claim 1, wherein the hole injection layer is a triphenylene derivative, the hole transporting layer is bis[N-(1-naphthyl)-N-phenyl]bendizine), and the electron transporting layer is tris(8-hydroxyquinolinato)aluminum (III)).

6. The display device according to claim 1, wherein the hole injection layer comprises a 2-TNATA (4,4',4"-tris(2-naphthylphenylamino)triphenylamine at a film thickness of 15 nm wherein the hole transporting layer is bis[N-(1-naphthyl)-N-phenyl]bendizine, the light emission layer is ADN (anthracene dinaphthyl) as a host material, and the electron transporting layer is Alq$_3$ (8-hydroxy quinoline aluminum(III)) at a film thickness of 10 nm.

7. The display device according to claim 6, wherein: the mixed layer is formed by co-vapor deposition of Alq$_3$ and Mg at a 100:5 weight ratio, respectively, to a film thickness of 5 nm, the protective layer of the connection layer is formed of (a) a material of formula (2):

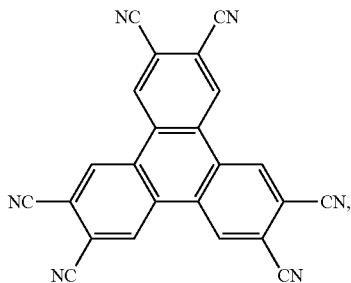

and
(b) Mg at a film thickness of 5 nm at 100:5 weight ratio, respectively, by co-vapor deposition by a vacuum vapor deposition method.

8. The display device according to claim 1, wherein the organic material constituting the mixed layer and an organic material constituting the electron transporting layer disposed above the light emission layer are the same organic material.

9. The display device according to claim 1, wherein the electron transportability of the organic material constituting the protective layer is higher than that of the organic material constituting the mixed layer.

10. A display device comprising:
a plurality of light emission units laminated between a cathode and an anode, where each light emission unit comprises at least an organic light emission layer; and
a connection layer is between the respective light emission units,
wherein,
the organic light emission layer in each light emission unit includes a hole injection layer, a hole transporting layer, a light emission layer, an electron transporting layer in direct succession in the recited order, beginning on the anode,
the connection layer having a laminate part comprising (1) a buffer layer of a thickness of 1 nm or less in contact with the organic light emission layer, the buffer layer (a) employing an oxide which contains at least one of an alkali metal and an alkaline-earth metal, and (b) the buffer layer having a hole blocking property resulting from disposing the buffer layer in contact with the organic light emission layer, (2) a mixed layer employing a charge transporting organic material having an electron transporting property and a metal material having an electron injecting property, the mixed layer being composed of the same material as the electron transporting layer in the organic light emission layer, the metal material reacts while reducing the charge transporting organic material to become transparent to ensure the electron injecting property, and (3) a protective layer employing at least one of triphenylene derivatives and azatriphenylene derivatives, the protective layer is oxidized to become light permeable to prevent oxidation of the mixed layer, are successively laminated from the anode side in direct succession.

11. The display device according to claim 10, wherein the charge transporting organic material constituting the connection layer is an electron transporting organic material.

12. The display device according to claim 11, wherein the mixed layer employing a charge transporting organic material comprises only an electron transporting organic material.

13. The display device according to claim 10, wherein the charge transporting organic material within the connection layer is a hole transporting organic material.

14. The display device according to claim 13, wherein the buffer layer, the mixed layer, and the protective layer were deposited successively utilizing vapor deposition.

15. The display device according to claim 10, wherein the buffer layer confines holes to the organic light emission layer.

16. The display device according to claim 10, wherein the layer employing an oxide constitutes a boundary layer on the anode side in the connection layer.

17. The display device according to claim 10, wherein the oxide is at least one selected from the group consisting of Li$_2$SiO$_3$, Li$_2$CO$_3$, Cs$_2$CO$_3$, Li$_2$WO$_4$ and SrO.

18. The display device according to claim 10, wherein the connection layer has a layer employing at least one of triphenylene derivatives and azatriphenylene derivatives represented by the following general formula (1), on the cathode side in the layer employing the charge transporting organic material:

Chemical formula 11

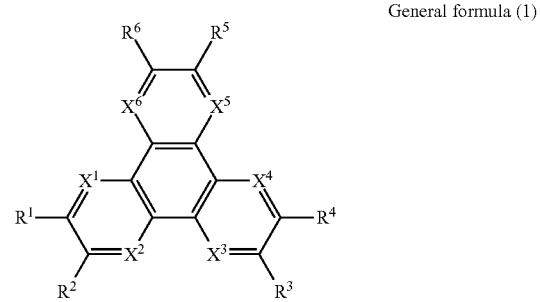

General formula (1)

wherein R$^1$ to R$^6$ each represent independently hydrogen, halogen, a hydroxyl group, an amino group, an arylamino group, a substituted or not-substituted carbonyl group of 20 or less carbon atoms, a substituted or not-substituted carbonyl ester group of 20 or less carbon atoms, a substituted or not-substituted alkyl group of 20 or less carbon atoms, a substituted or not-substituted alkenyl group of 20 or less carbon atoms, a substituted or not-substituted alkoxyl group of 20 or less carbon atoms, a substituted or not-substituted aryl group of 30 or less carbon atoms, a substituted or not-substituted heterocyclic group of 30 or less carbon atoms, or a substituent selected from a nitrile group, a nitro group, a cyano group, or a silyl group, wherein adjacent R$^m$, where m=1 to 6, may be joined to each other by way of a cyclic structure, and X$^1$ to X$^6$ each represent independently a carbon or nitrogen atom.

19. The display device according to claim 18, wherein the layer employing at least one of triphenylene derivatives and azatriphenylene derivatives constitutes a boundary layer on the cathode side in the connection layer.

20. The light emission layer according to any one of claims 1 or 10, wherein the light emission layer is also configured to be an electron transporting light emission layer.

21. The light emission layer according to any one of claims 1 or 10 wherein the light emission layer is also configured to be a hole transporting light emission layer.

* * * * *